US008816949B2

(12) United States Patent
Tobita

(10) Patent No.: US 8,816,949 B2
(45) Date of Patent: Aug. 26, 2014

(54) SHIFT REGISTER CIRCUIT AND IMAGE DISPLAY COMPRISING THE SAME

(71) Applicant: Mitsubishi Electric Corporation, Tokyo (JP)

(72) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/914,045

(22) Filed: Jun. 10, 2013

(65) Prior Publication Data

US 2013/0272487 A1  Oct. 17, 2013

Related U.S. Application Data

(62) Division of application No. 13/082,128, filed on Apr. 7, 2011, now Pat. No. 8,493,309, which is a division of application No. 11/739,399, filed on Apr. 24, 2007, now abandoned.

(30) Foreign Application Priority Data

Apr. 25, 2006  (JP) ................. 2006-120118
Feb. 8, 2007  (JP) ................. 2007-028894

(51) Int. Cl.
    *G09G 3/36* (2006.01)
(52) U.S. Cl.
    USPC .............. 345/98; 345/92; 345/93; 345/96
(58) Field of Classification Search
    USPC .................................. 345/87–100
    See application file for complete search history.

(56) References Cited

U.S. PATENT DOCUMENTS

| 5,222,082 A | 6/1993 | Plus |
| 6,052,426 A | 4/2000 | Maurice |
| 6,064,713 A | 5/2000 | Lebrun et al. |
| 6,690,347 B2 | 2/2004 | Jeon et al. |

(Continued)

FOREIGN PATENT DOCUMENTS

| EP | 0 535 569 B1 | 4/1993 |
| JP | 5-267636 | 10/1993 |

(Continued)

OTHER PUBLICATIONS

Office Action issued on Feb. 22, 2011, in Japanese Patent Application No. 2007-028894.

(Continued)

*Primary Examiner* — Vijay Shankar
(74) *Attorney, Agent, or Firm* — Oblon, Spivak, McClelland, Maier & Neustadt, L.L.P.

(57) ABSTRACT

In a shift register circuit, a defective operation while an output signal is not outputted and a drive capability lowering while the output signal is outputted are prevented. A unit shift register comprises a first transistor for supplying a clock signal inputted to a first clock terminal to an output terminal, and the first transistor is driven by a drive circuit. A second transistor is connected between the gate of the first transistor and the output terminal and has a gate connected to the first clock terminal. The second transistor connects the gate of the first transistor to the output terminal based on the clock signal when the gate of the first transistor is at L (Low) level.

4 Claims, 36 Drawing Sheets

(56) References Cited

U.S. PATENT DOCUMENTS

| | | |
|---|---|---|
| 7,023,410 B2 | 4/2006 | Lee et al. |
| 7,289,594 B2 | 10/2007 | Moon |
| 7,319,452 B2 | 1/2008 | Moon |
| 7,369,111 B2 | 5/2008 | Jeon et al. |
| 7,486,269 B2 | 2/2009 | Moon |
| 7,532,701 B2 | 5/2009 | Moon |
| 7,825,888 B2 | 11/2010 | Tobita et al. |
| 8,493,309 B2 * | 7/2013 | Tobita .................... 345/98 |
| 2005/0008114 A1 | 1/2005 | Moon |
| 2005/0220263 A1 | 10/2005 | Moon |
| 2006/0001637 A1 | 1/2006 | Pak et al. |
| 2006/0109230 A1 | 5/2006 | An et al. |
| 2007/0263763 A1 | 11/2007 | Moon |
| 2010/0111245 A1 | 5/2010 | Tobita |

FOREIGN PATENT DOCUMENTS

| | | |
|---|---|---|
| JP | 6-505605 | 6/1994 |
| JP | 10-500243 | 1/1998 |
| JP | 11-502355 | 2/1999 |
| JP | 2004-295126 | 10/2004 |
| JP | 2005-50502 | 2/2005 |
| JP | 2005-293817 | 10/2005 |
| JP | 2007-257812 | 10/2007 |

OTHER PUBLICATIONS

Japanese Office Action issued Jan. 17, 2012, in Patent Application No. 2007-028894 (with partial English-language translation).

* cited by examiner

F I G . 2
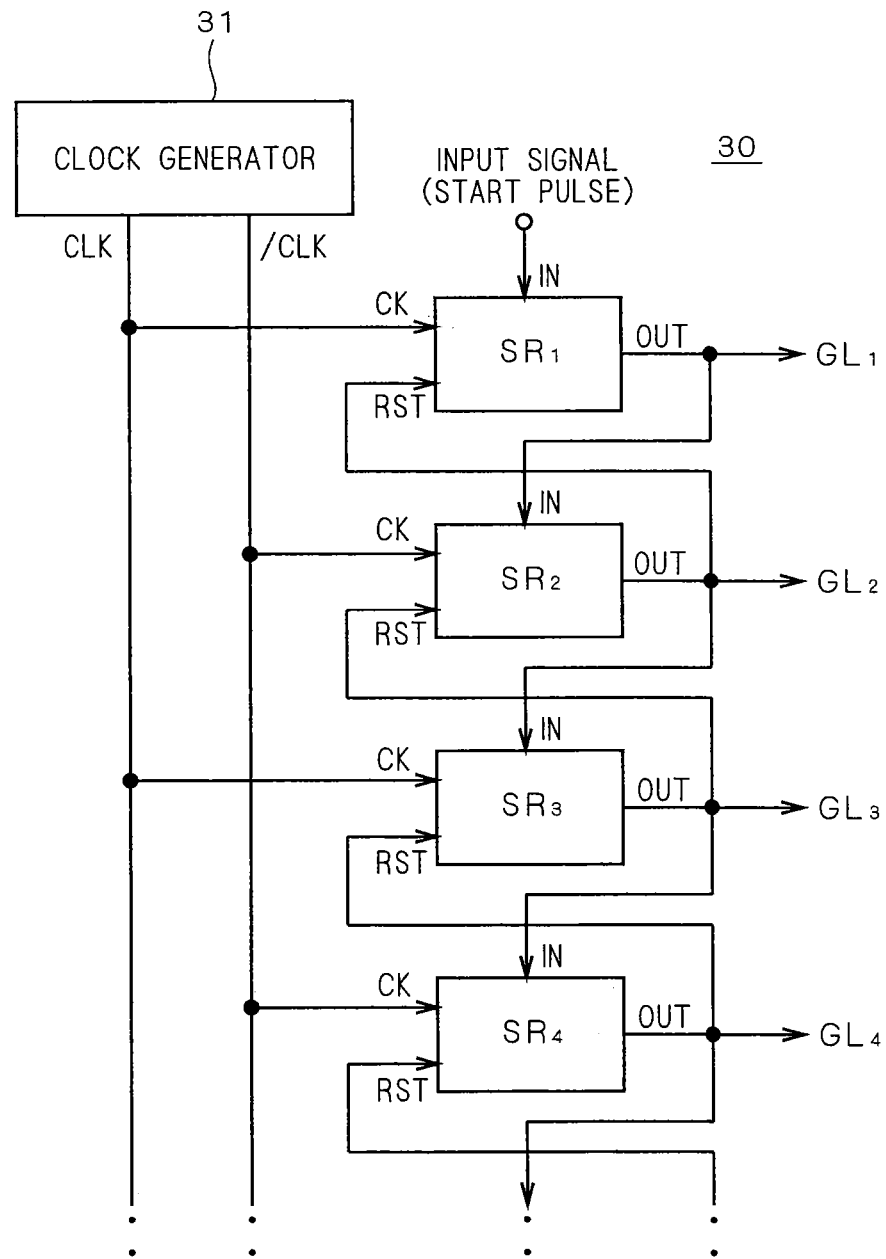

F I G . 3
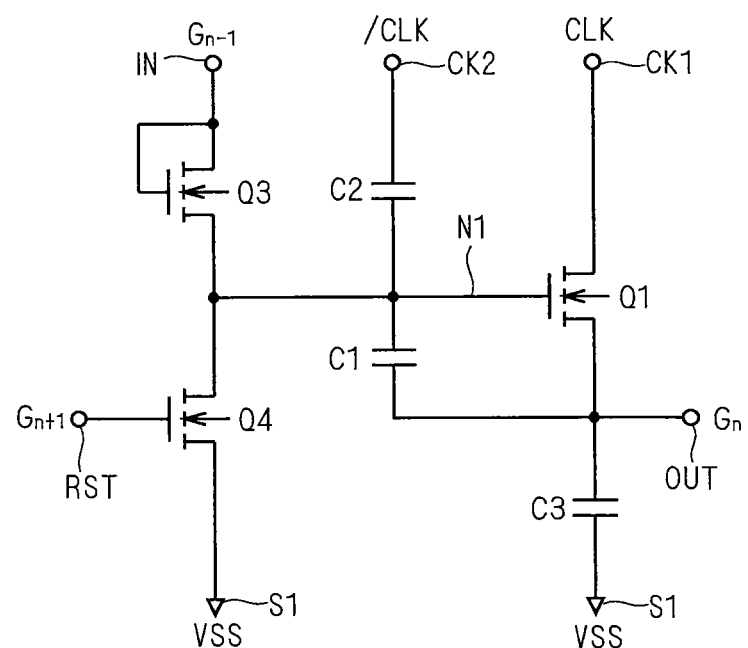

F I G . 6
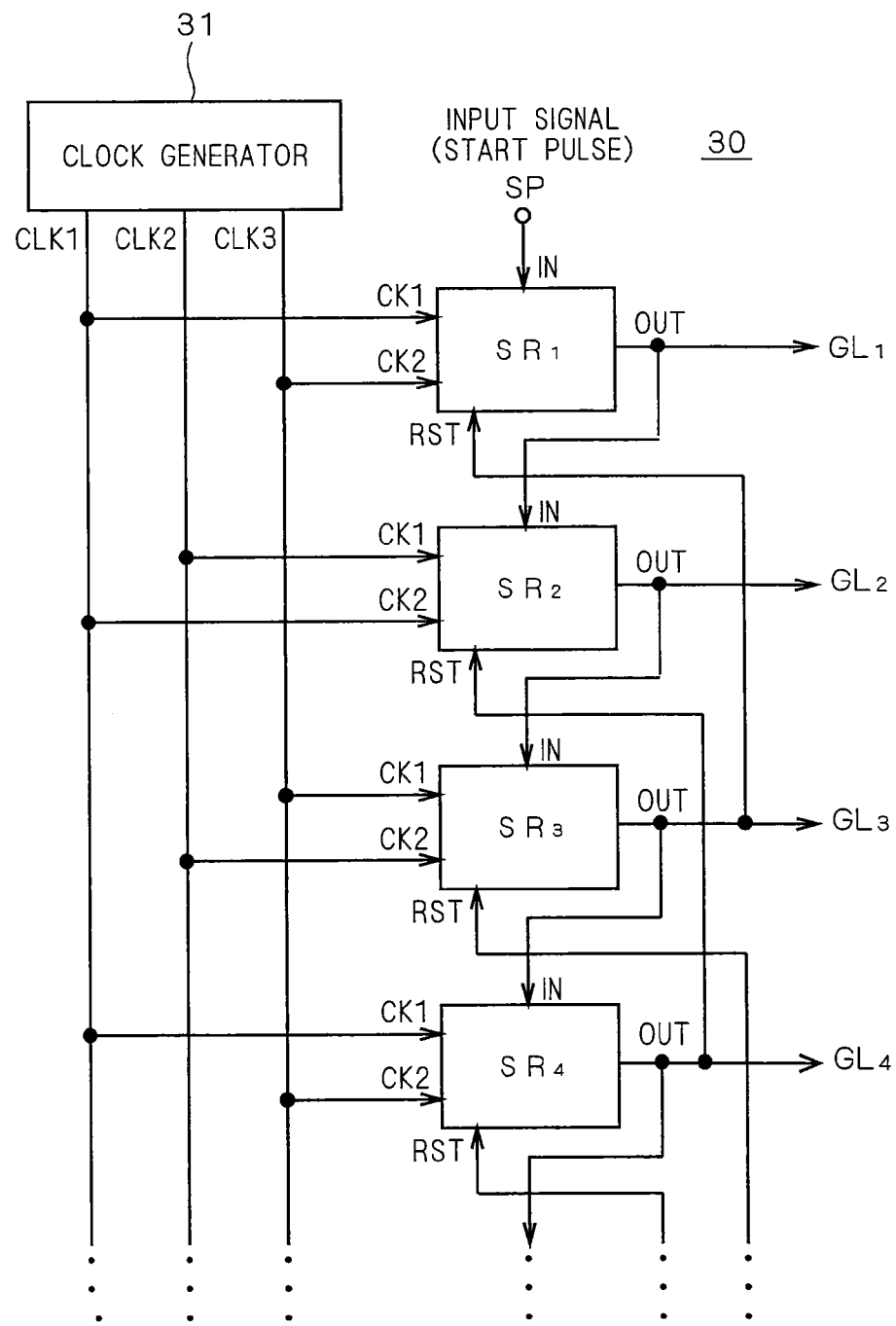

F I G . 7
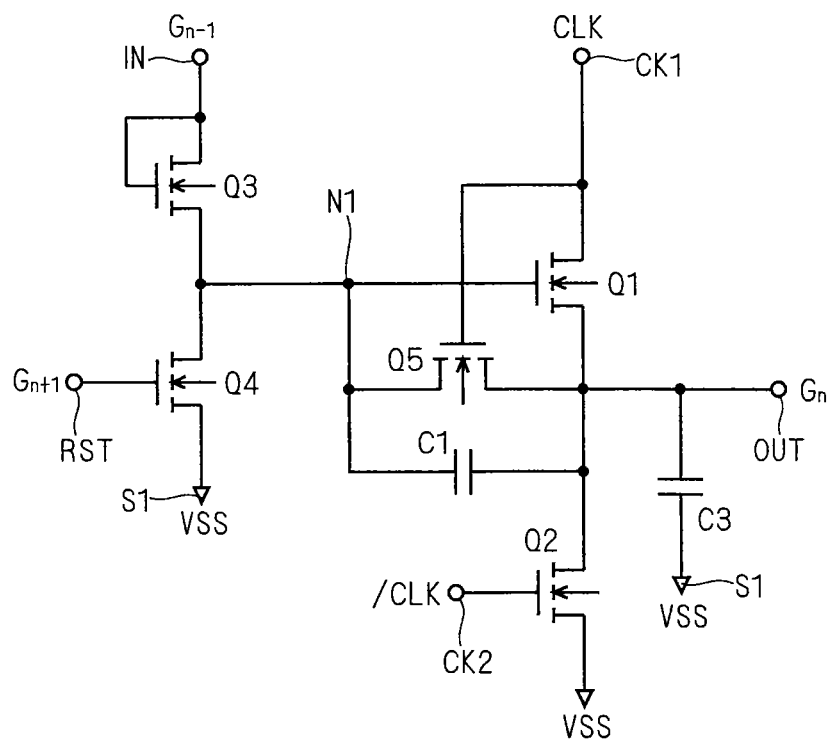

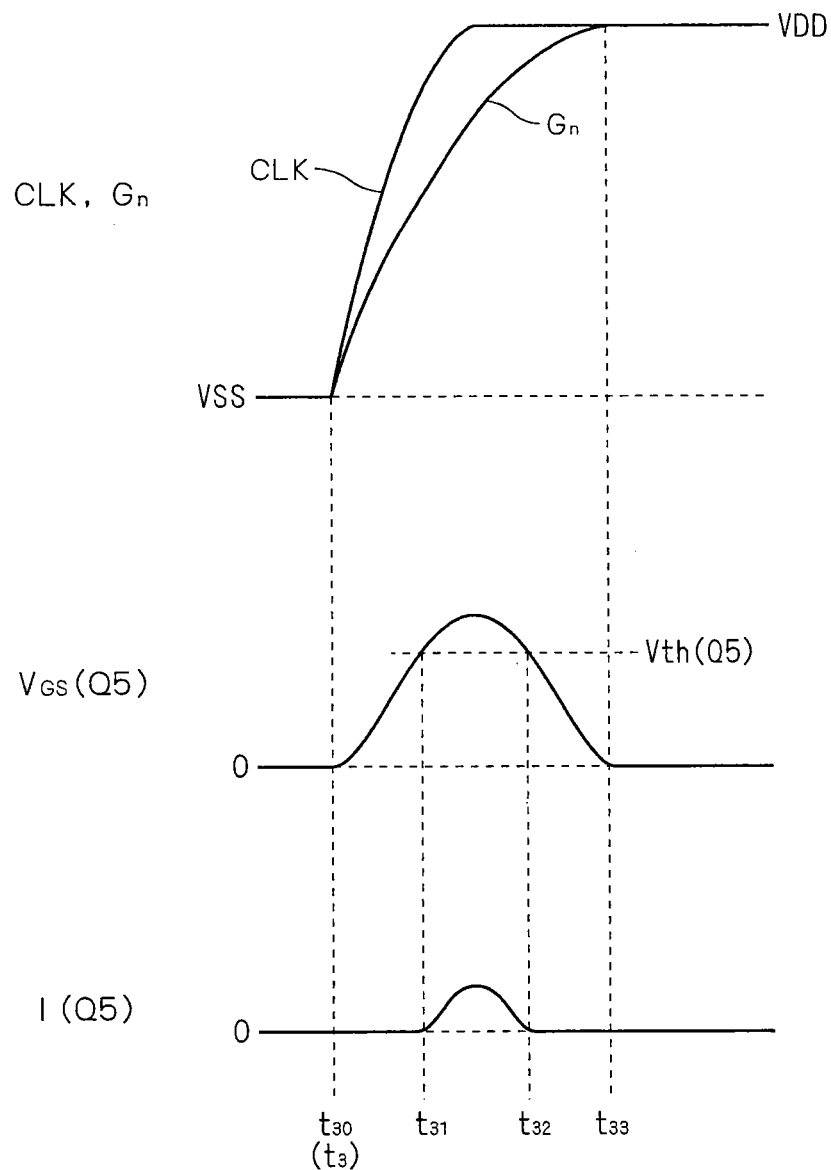
F I G . 9

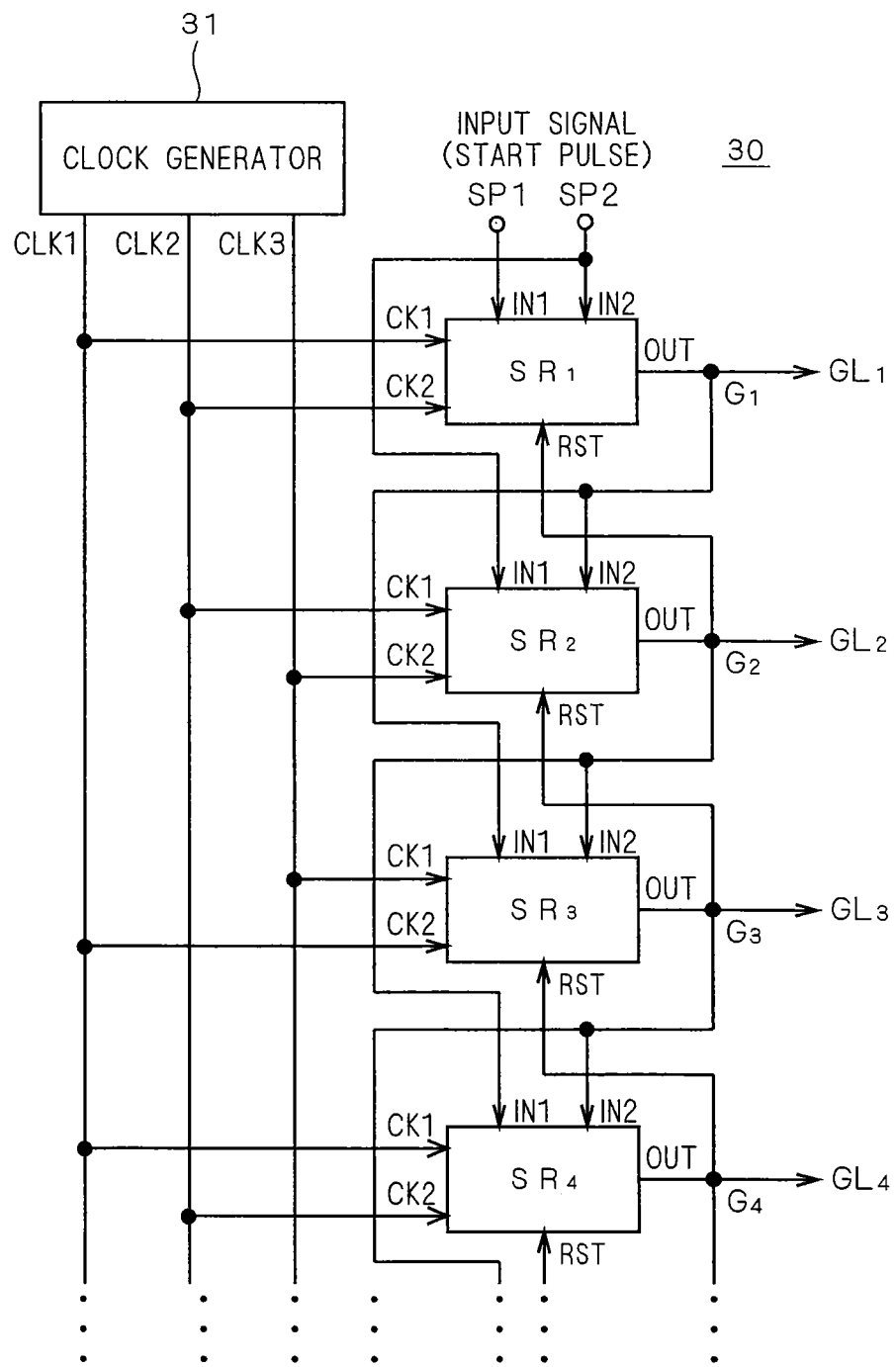
F I G . 1 5

F I G . 1 6
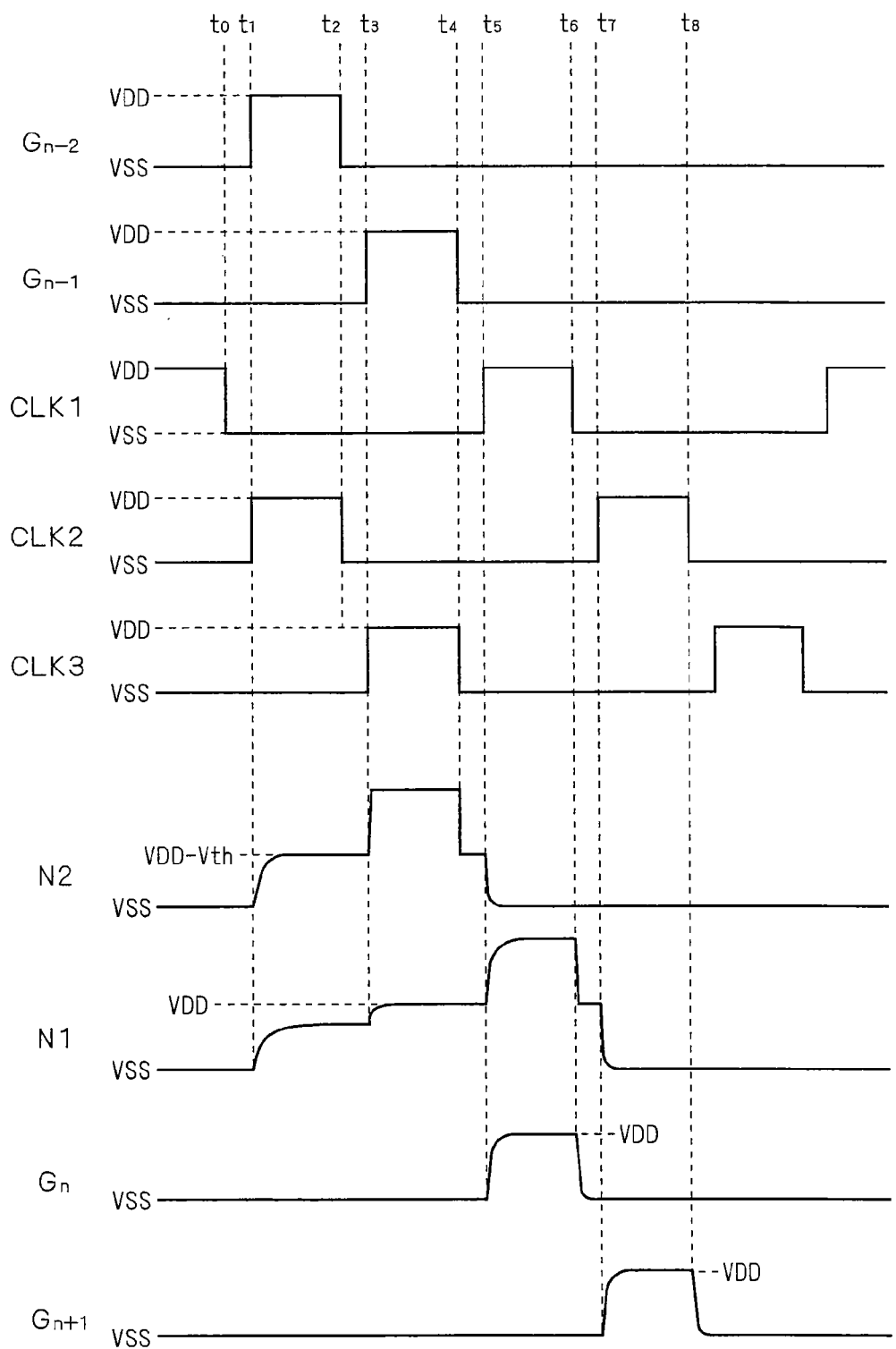

F I G . 2 0
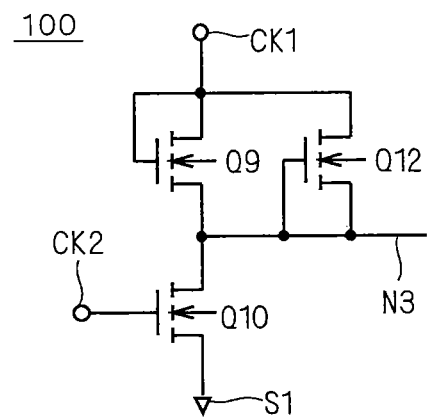
F I G . 2 1
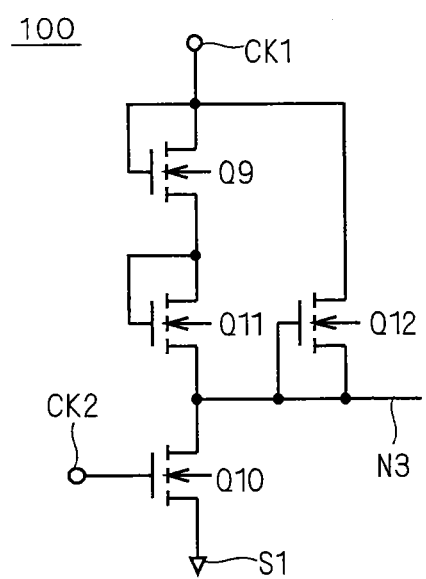

F I G . 2 2
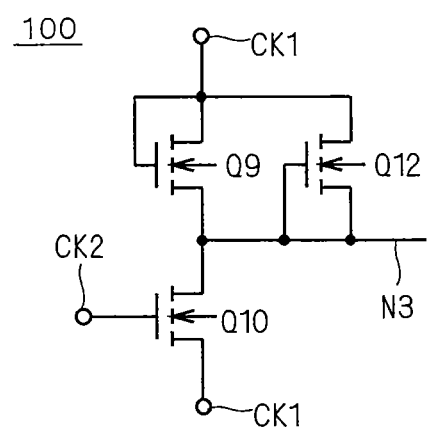

F I G . 2 3
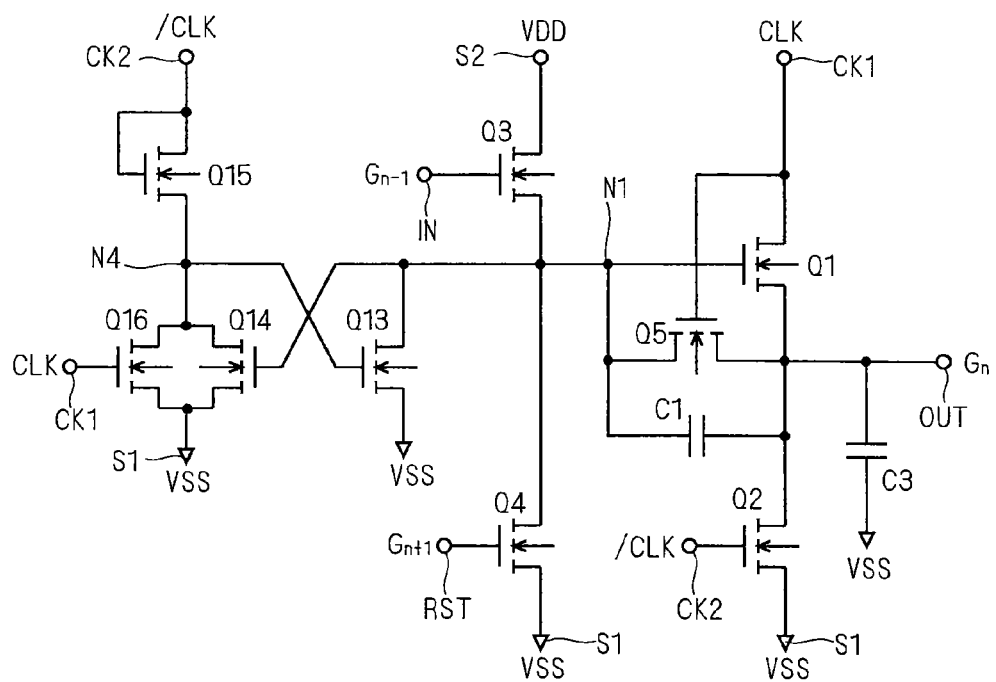

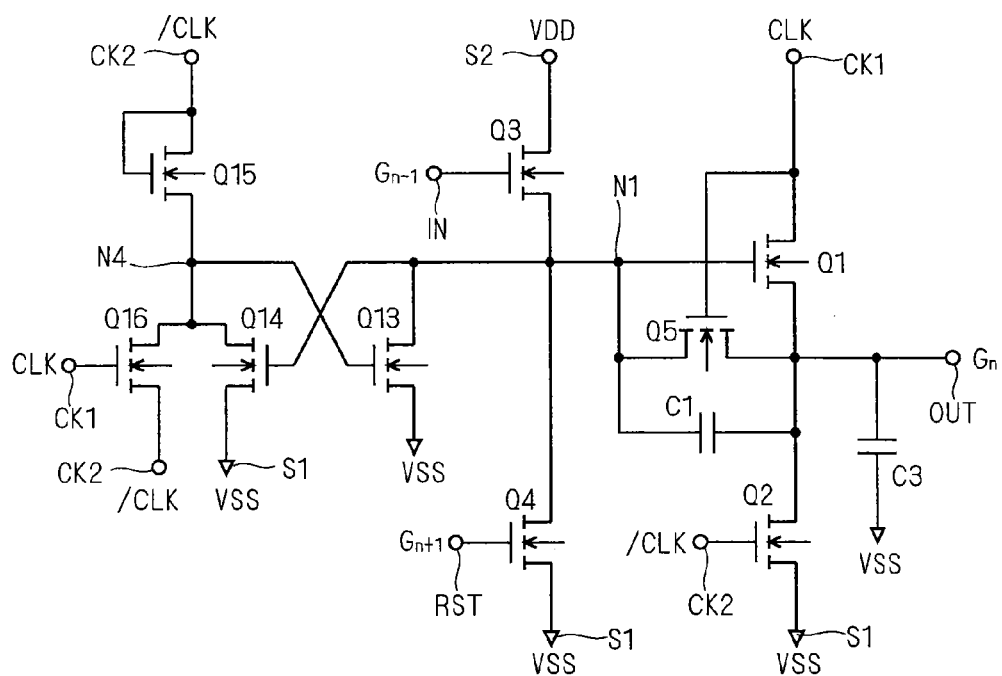
F I G . 2 6

F I G . 3 2
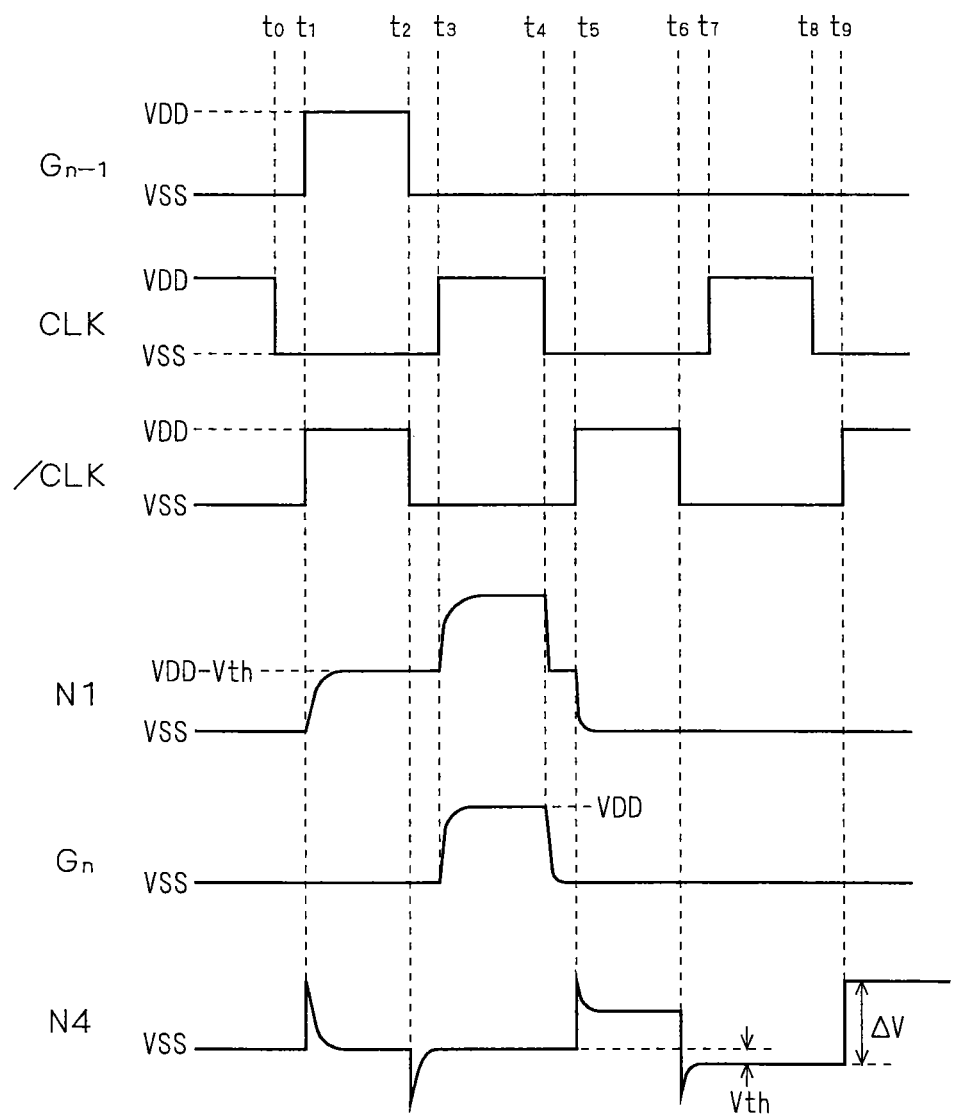

F I G . 3 3
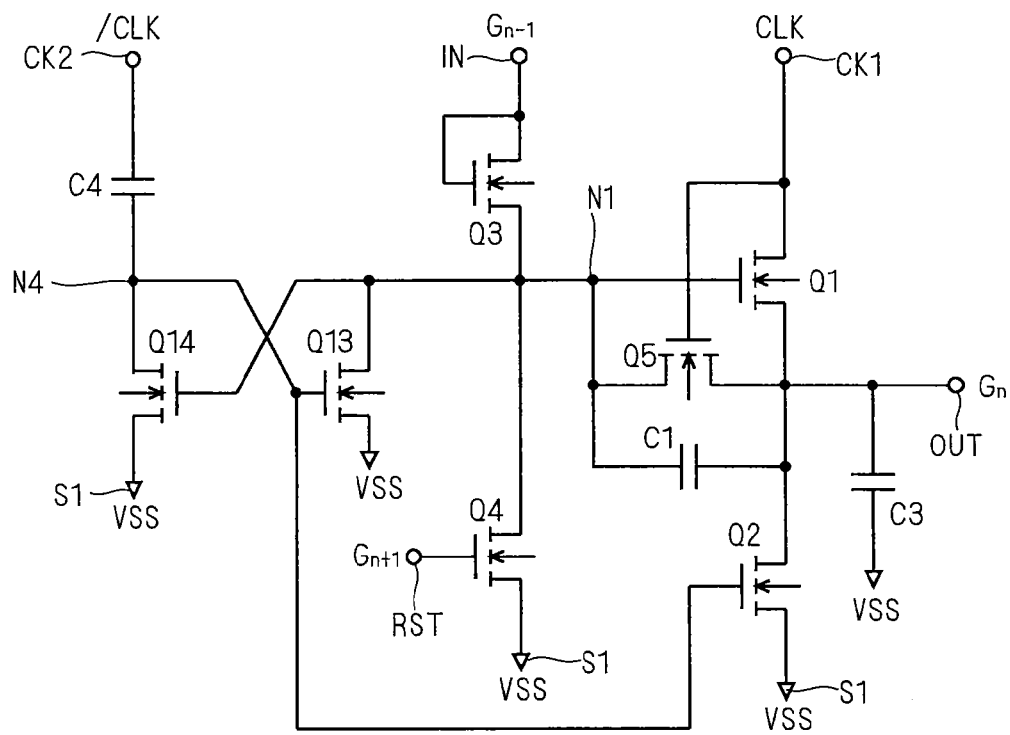

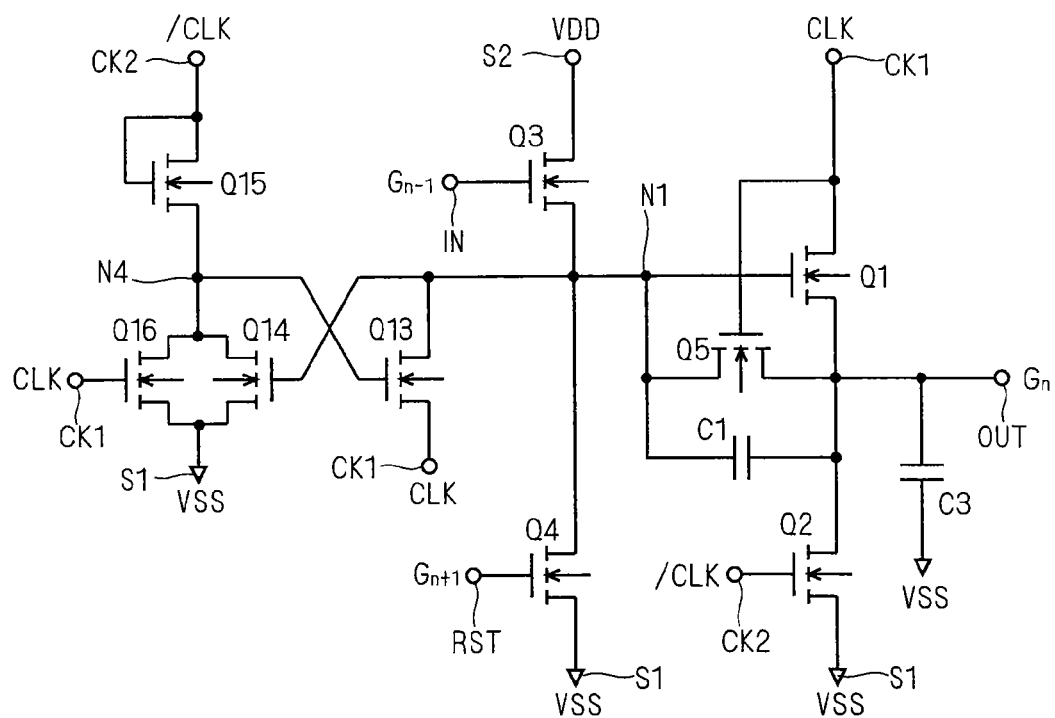
F I G . 3 5

F I G. 3 6
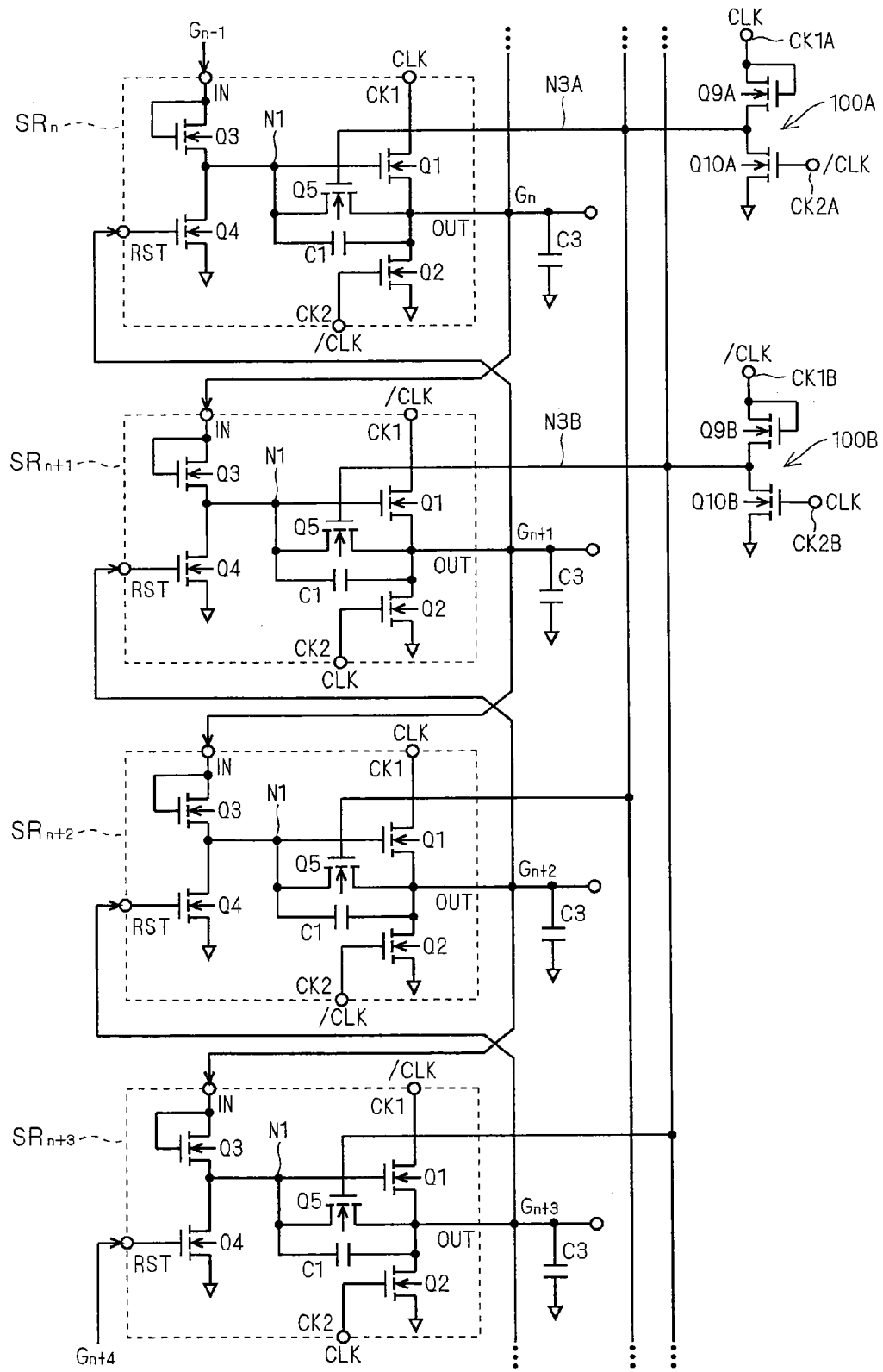

SHIFT REGISTER CIRCUIT AND IMAGE DISPLAY COMPRISING THE SAME

CROSS-REFERENCE TO RELATED APPLICATIONS

This application is a divisional of U.S. application Ser. No. 13/082,128, filed Apr. 7, 2011, which is a divisional of U.S. application Ser. No. 11/739,399, filed Apr. 24, 2007, the contents of which are incorporated herein by reference, and is based upon and claims the benefit of priority from prior Japanese Patent Application Nos. 2006-120118, filed Apr. 25, 2006 and 2007-028894, filed Feb. 8, 2007.

BACKGROUND OF THE INVENTION

1. Field of the Invention

The present invention relates to a shift register circuit and more particularly, to a shift register circuit used in such as a scan line drive circuit in an image display and comprising only the same conductivity type field effect transistor.

2. Description of the Background Art

According to an image display such a liquid crystal display (referred to as the "display" hereinafter), a gate line (scan line) is provided with respect to each pixel row (pixel line) of a display panel in which a plurality of pixels are arranged like a matrix, and the display image is updated by sequentially selecting and driving the gate line every cycle of one horizontal period of a display signal. Thus, as a gate line drive circuit (scan line drive circuit) for sequentially selecting and driving the pixel line, that is, the gate line, a shift register that makes one round of shifting for one frame period of the display signal can be used.

It is preferable that the shift register used in the gate line drive circuit comprises only the same conductivity type field effect transistor in order to reduce the steps in the manufacturing process of the display. Therefore, various kinds of shift registers comprising only an N-type or P-type field effect transistor and displays mounting it have been proposed (in Japanese Patent Application Laid Open No. 10-500243, for example). The field effect transistor includes an MOS (Metal Oxide Semiconductor) transistor, a TFT (Thin Film Transistor) and the like.

In addition, the shift register as the gate line drive circuit is constituted such that a plurality of cascade-connected shift register circuits are provided with respect to each pixel line, that is, each gate line. According to this specification, each of the plurality of shift register circuits that constitute the gate line drive circuit is referred to as the "unit shift register" for simplification of the description.

Japanese Patent Application Laid-Open No. 10-500243 discloses a unit shift register constituted such that the number of transistors in a circuit is decreased as compared with a conventional one (FIG. 2 in Japanese Patent Application Laid-Open No. 10-500243, for example). According to the unit shift register (refer to FIG. 3 in this specification), a first transistor (Q1) is provided as an output pull-up transistor connected between a first clock terminal (CK1) to which a predetermined first clock signal is inputted and an output terminal (OUT). The first transistor is turned on in response to a predetermined input signal ($G_{n-1}$) and turned off in response to a predetermined reset signal ($G_{n-1}$). Thus, the output signal ($G_n$) of the unit shift register is outputted when the first transistor is turned on by the input signal and the first clock signal is transmitted to the output terminal.

Meanwhile, in a period the unit shift register does not output the output signal, the first transistor is kept in an off state so that the first clock signal is not transmitted to the output terminal. Thus, the input signal is not inputted in that period. However, in fact, when the first clock signal is inputted when the first transistor is in the off state, the gate potential of the first transistor tries to rise due to the coupling through the overlap capacity between the gate and drain of the first transistor. Thus, when the gate potential exceeds the threshold voltage of the first transistor, the first transistor to be kept in the off state is unnecessarily turned on, which causes a defective operation of the unit shift register.

According to the unit shift register in Japanese Patent Application Laid-Open No. 10-500243, a second clock signal (/CLK) that is a complementarity signal of the first clock signal is applied to the gate of the first transistor through a first capacity element (C2) in order to prevent the defective operation. That is, the variation in the gate potential of the first transistor caused by the first clock signal can be offset by the second clock signal, so that the gate potential is prevented from rising.

Meanwhile, when the unit shift register outputs the output signal, the output terminal, that is, the source of the first transistor rises and becomes H (High) level. Therefore, when it is assumed that the gate potential of the first transistor is constant, the voltage between the gate and source of the first transistor is lowered while the output signal is outputted and the drive capability (current flowing capability) is lowered. In this case, the problem is that the rising and falling speeds of the output signal are lowered and it is difficult to implement the high-speed operation. Especially, since it is necessary to charge the gate line at high speed to activate it in order to ensure sufficient writing time of data to the pixel, in the gate line drive circuit of the display, lowering in the drive capability of the first transistor, that is, lowering in the drive capability of the unit shift register becomes a big problem.

Thus, according to the unit shift register in Japanese Patent Application Laid-Open No. 10-500243, a second capacity element (C1) is further provided between the output terminal and the gate of the first transistor, so that the gate of the first transistor rises in voltage due to the coupling through the second capacity element at the time of outputting the output signal. That is, even when the potential of the output terminal rises, since the gate potential of the first transistor also rises, the voltage between the gate and source of the first transistor can be highly kept. Therefore, there is an effect that the drive capability of the first transistor can be prevented from being lowered when the output signal is outputted.

However, according to the unit shift register in Japanese Patent Application Laid-Open No. 10-500243, as described above, the first capacity element (C2) for preventing the gate potential from rising due to the first clock signal (CLK) is connected to the gate of the first transistor (Q1). Since the first capacity element functions to prevent the variation in the gate potential of the first transistor when the output signal is outputted also, the rising action of the gate of the first transistor by the second capacity element (C1) is also prevented. That is, the effect of the second capacity element (C1) that prevents the drive capability of the first transistor from being lowered at the time of outputting the output signal is weakened by the first capacity element (C2). As a result, when the drive capability of the first transistor is not sufficiently ensured, the problem the high speed operation is difficult arises again.

As described above, according to the unit shift register in Japanese Patent Application Laid-Open No. 10-500243, the first capacity element that prevents the defective operation while the output signal is not outputted results in weakening the effect of the second capacity element that the drive capability of the shift register can be ensured while the output signal is outputted, so that it is said that the two operations are in antinomy relation.

SUMMARY OF THE INVENTION

It is an object of the present invention to provide a shift register circuit in which a defective operation is prevented while an output signal is not outputted and drive capability is prevented from being lowered while the output signal is outputted.

A shift register circuit according to the present invention includes an input terminal, an output terminal, a first clock terminal, and a reset terminal, a first transistor for supplying a first clock signal inputted to the first clock terminal, to the output terminal, a drive circuit, and switching circuit. The drive circuit drives the first transistor by charging the control electrode of the first transistor based on a signal inputted to the input terminal and discharging the control electrode of the first transistor based on a signal inputted to the reset terminal. The shift register further comprises a switching circuit for making the control electrode of the first transistor and the output terminal conductive based on the first clock signal in a state when the control electrode of the first transistor is discharged.

The level of the control electrode of the first transistor sufficiently rises because a current does not flow in the switching circuit while the output signal (first clock signal transmitted to the output terminal through the first transistor) is outputted, so that the drive capability of the first transistor can be highly kept. Thus, the rising and falling speed of the output signal can be increased, which contributes to the high speed operation. In addition, since the switching circuit is turned on when the output signal is not outputted (non-selected period), the control electrode of the first transistor is discharged and kept at L level. Thus, it is prevented that the first transistor is turned on and the output signal unnecessarily becomes H level in the non-selected period. That is, both effect that the defective operation is prevented in the non-selected state and effect that the drive capability is prevented from being lowered while the output signal is outputted.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram showing the constitution example of a gate line drive circuit using a unit shift register;

FIG. 3 is a circuit diagram showing the constitution of a conventional unit shift register;

FIG. 6 is a block diagrams showing the constitution example of a gate line drive circuit using the unit shift register;

FIG. 7 is a circuit diagram showing the constitution of a unit shift register according to an embodiment 1;

FIG. 9 is a view to explain the operation of the unit shift register according to the embodiment 1;

FIG. 15 is a block diagram showing the constitution example of a gate line drive circuit according to the embodiment 4;

FIG. 16 is a view to explain the operation of the unit shift register according to the embodiment 4;

FIG. 20 is a circuit diagram showing a variation of the level adjustment circuit according to the embodiment 6;

FIG. 21 is a circuit diagram showing a variation of the level adjustment circuit according to the embodiment 6;

FIG. 22 is a circuit diagram showing a variation of the level adjustment circuit according to the embodiment 6;

FIG. 23 is a circuit diagram showing the constitution of a unit shift register according to an embodiment 7;

FIG. 26 is a circuit diagram showing the constitution of the unit shift register according to the embodiment 7;

FIG. 32 is a timing chart showing the operation of the unit shift register according to the embodiment 9;

FIG. 33 is a circuit diagram showing the constitution of the unit shift register according to the embodiment 9;

FIG. 35 is a circuit diagram showing the constitution of a unit shift register according to an embodiment 11;

FIG. 36 is a circuit diagram showing the constitution of a multistage shift register according to an embodiment 12;

DESCRIPTION OF THE PREFERRED EMBODIMENTS

Embodiments of the present invention will be described with reference to the drawings hereinafter. In addition, the same reference signs are allotted to a component having the same or corresponding function in each drawing to avoid duplication of its description.

Embodiment 1

Figure 1:
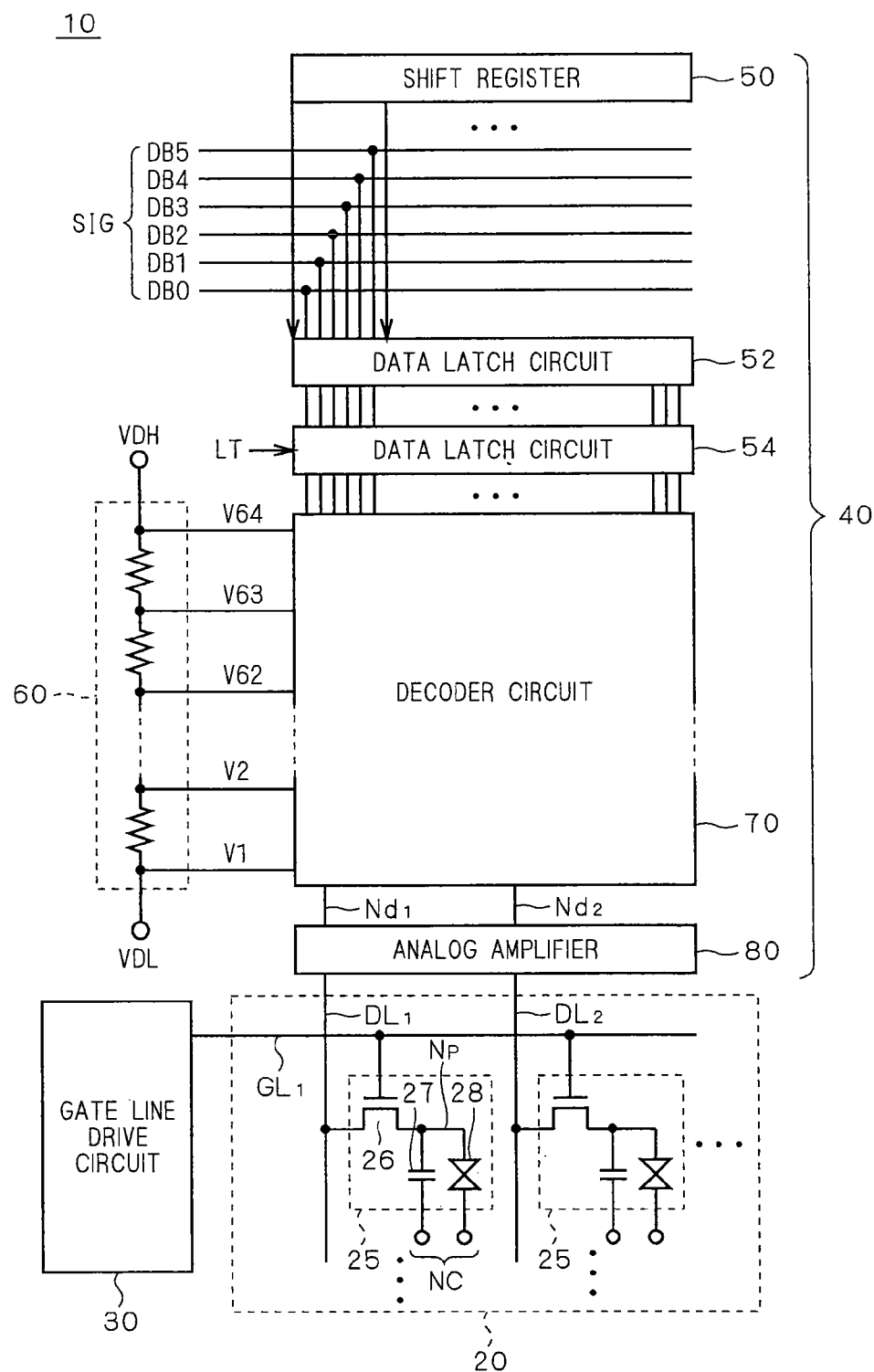
FIG. 1 is a schematic block diagram showing the constitution of a display according to an embodiment of the present invention.

FIG. 1 is a schematic block diagram showing the constitution of a display according to an embodiment 1 of the present invention and showing the whole constitution of a liquid crystal display 10 as a representative example of the display.

The liquid crystal display 10 comprises a liquid crystal array 20, a gate line drive circuit (scan line drive circuit) 30 and a source driver 40. Although it will be clear from the following description, a shift register according to this embodiment of the present invention is mounted on the gate line drive circuit 30.

The liquid crystal array 20 comprises a plurality of pixels 25 arranged like a matrix. Gate lines $GL_1$, $GL_2$, ... (collectively called the "gate line GL") are connected to rows of pixels (referred to as the "pixel lines" also hereinafter), respectively and data lines DL1, DL2, ... (collectively called the "data line DL") are connected to the columns of pixels (referred to as the "pixel columns" also hereinafter), respectively. In FIG. 1, pixels 25 in the first and second columns in the first row, and the gate line $GL_1$ and data lines DL1 and DL2 corresponding to the pixels 25 are representatively shown.

Each pixel 25 has a pixel switch element 26 provided between the corresponding data line DL and a pixel node Np and a capacitor 27 and a liquid crystal display element 28 connected in parallel between the pixel node Np and a common electrode node NC. The orientation of a liquid crystal in the liquid crystal display element 28 varies according to the voltage difference between the pixel node Np and the common electrode node NC, and accordingly the display luminance of the liquid crystal display element 28 varies. Thus, the luminance of each pixel can be controlled by a display voltage transferred to the pixel node Np through the data line DL and the pixel switch pixel 26. That is, when the intermediate voltage difference between the voltage difference corresponding to a maximum luminance and the voltage difference corresponding to a minimum luminance is applied between the pixel node Np and the common electrode node NC, intermediate luminance can be provided. Therefore, when the above display voltage is set sequentially, continuous luminance can be provided The gate line drive circuit 30 sequentially selects and drives the gate line GL based on a predetermined scan period. The gate electrode of the pixel switch element 26 is connected to the corresponding gate line GL. While the specific gate line GL is selected, in each pixel connected to that gate line GL, the pixel switch element 26 becomes conductive and the pixel node Np is connected to the corresponding data line DL. Thus, the display voltage transferred to the pixel node Np is held by the capacitor 27. In general, the pixel switch element 26 comprises a TFT formed on the same insulator substrate (glass substrate, a resin substrate and the like) as that of the liquid crystal display element 28.

The source driver 40 outputs the display voltage sequentially set by a display signal SIG that is an N-bit digital signal to the data line DL. Here, as one example, the display signal SIG is a 6-bit signal and comprises display signal bits DB0 to DB5. Based on the 6-bit display signal, tone display of $2^6=64$ tones can be provided in each pixel. Furthermore, a color display unit is formed of three pixels of R (Red), G (Green) and B (Blue), color display of about two hundred sixty thousand colors can be provided.

In addition, as shown in FIG. 1, the source driver 40 comprises a shift register 50, a data latch circuits 52 and 54, a tone voltage generation circuit 60, a decoder circuit 70, and an analog amplifier 80.

According to the display signal SIG, display signal bits DB0 to DB5 corresponding to each display luminance of the pixel 25 is serially generated. That is, the display signal bits DB0 to DB5 at each timing show the display luminance of the one pixel 25 in the liquid crystal array 20.

The shift register 50 instructs the data latch circuit 52 to take in the display signal bits DB0 to DB5 at a timing synchronized with the period when the setting of the display signal SIG is switched. The data latch circuit 52 sequentially takes in the serially generated display signal SIG and stores the display signal SIG for one pixel line.

A latch signal LT inputted to the data latch circuit 54 is activated at the timing when the display signal SIG for the one pixel line is taken in the data latch circuit 52. The data latch circuit 54 responds to it and takes in the display signal SIG for the one pixel line stored in the data latch circuit 52 at that time.

The tone voltage generation circuit 60 comprises 63 voltage divider resistances connected in series between a high voltage VDH and a low voltage VDL and generates 64-stages tone voltages V1 to V64.

The decoder circuit 70 decodes the display signal SIG stored in the data latch circuit 54 and selects the voltage to be outputted to each of decode output nodes $Nd_1$, $Nd_2$, ... (collectively called the "decode output node Nd") from the tone voltages V1 to V64 based on the above decoded result and outputs it.

As a result, the display voltage (one of the tone voltages V1 to V64) corresponding to the display signal SIG for the one pixel line stored in the data latch circuit 54 is outputted to the decode output node Nd at the same time (in parallel). In addition, in FIG. 1, the decode output nodes $Nd_1$ and $Nd_2$ corresponding to the data lines DL1 and DL2 in the first and second columns are representatively shown.

The analog amplifier 80 outputs analog voltage corresponding to each display voltage outputted from the decoder circuit 70 to each of the decode output nodes $Nd_1$, $Nd_2$, ..., to each of the data lines DL1, DL2, ....

Based on the predetermined scan period, the source driver 40 outputs the display voltages corresponding to the series of the display signals SIG repeatedly to the data line DL for one pixel line, and the gate line drive circuit 30 synchronizes with the scan period and drives the gate lines $GL_1$, $GL_2$, ... sequentially, whereby an image based on the display signal SIG is displayed in the liquid crystal array 20.

In addition, although the constitution of the liquid crystal display 10 in which the gate line drive circuit 30 and the source driver 40 are integrally formed with the liquid crystal array 20 is shown in FIG. 1, the gate line drive circuit 30 and the source driver 40 may be provided as an external circuit of the liquid crystal array 20.

FIG. 2 is a view showing the constitution of the gate line drive circuit 30. The gate line drive circuit 30 comprises multistage shift register consisting of a plurality of cascade-connected unit shift registers $SR_1$, $SR_2$, $SR_3$, $SR_4$, ... (collectively referred to as the "unit shift register SR" hereinafter). The unit shift register SR is provided with respect to each pixel line, that is, with respect to each gate line GL.

In addition, a clock generator 31 shown in FIG. 2 inputs two-phase clock signals CLK and /CLK having different phases to the unit shift register SR of the gate line drive circuit 30. These clock signals CLK and /CLK are controlled so as to be activated sequentially at the timing synchronized with the scan period of the display. That is, the clock signals CLK and /CLK are complementarity signals.

Each unit shift register SR comprises an input terminal IN, an output terminal OUT, a reset terminal RST, a first clock terminal CK1 and a second clock terminal CK2. As shown in FIG. 2, either the clock signal CLK, or /CLK outputted from the clock generator 31 is supplied to the first and second clock terminals CK1 and CK2 of each unit shift register SR. The gate line GL is connected to the output terminal OUT of the unit shift register SR. That is, the signal (output signal) outputted to the output terminal OUT becomes a horizontal (or vertical) scan pulse for activating the gate line GL.

A start pulse SP corresponding to the head of each frame period of the pixel signal is inputted to the input terminal IN of the first stage unit shift register $SR_1$. To the input terminals IN after the second stages, the output signals of the previous stages are inputted. That is, the input terminals IN after the second stages are connected to the output terminal OUT of the previous unit shift register SR.

According to the gate line drive circuit 30 having this constitution, the unit shift register SR shifts the input signal from the previous stage (output signal of the previous stage) temporally in synchronization with the clock signals CLK and /CLK and transmits it to the corresponding gate line GL and the next stage unit shift register SR (the operation of the unit shift register SR will be described in detail below). As a result, the series of the unit shift registers SR function as a gate line driving unit that activates sequentially the gate line GL at the timing based on the predetermined scan period.

Here, in order to simplify the description of the present invention, the conventional unit shift register (disclosed in the above Japanese Patent Application Laid-Open No. 10-500243) will be described. FIG. 3 is a circuit diagram showing the constitution of the conventional unit shift register. In addition, according to a gate line drive circuit 30, since the constitution of each of the cascade-connected unit shift registers SR is the almost the same, the constitution of one unit shift register will be described only in the following description. In addition, although the transistor constituting the unit shift register SR is a field effect transistor having the same conductivity type, it is assumed that the transistor is an N-type TFT in this embodiment.

As shown in FIG. 3, the conventional unit shift register SR comprises a first power supply terminal S1 to which a low potential side power supply potential VSS is supplied as well as an input terminal IN, an output terminal OUT, a reset terminal RST and first and second clock terminals CK1 and CK2 described with reference to FIG. 2. Although the low potential side power supply potential VSS is set at a reference potential (=0V) of the circuit in the following description, the reference potential is set based on the voltage of data to be written in the pixel in an actual usage, and the low potential side power supply voltage VSS is set to −12V, for example.

In addition, the clock signals CLK and /CLK are controlled so as to be moved to H (High) level and L (Low) level at the same timing. That is, the clock signal /CLK falls when the clock signal CLK rises and the clock signal /CLK rises when the clock signal CLK falls.

As shown in FIG. 3, the output stage of the unit shift register SR comprises a transistor Q1 connected between the output terminal OUT and the first clock terminal CK1. That is, the transistor Q1 functions as an output pull-up transistor that supplies the clock signal from the first clock terminal CK1 to the output terminal OUT. A description will be made assuming that the node connected to the gate (control electrode) of the transistor Q1 is a "node N1" hereinafter.

A capacity element C1 is provided between the gate and source of the transistor Q1 (that is between the output terminal OUT and the node N1), and a capacity element C2 is provided between the node N1 and the second clock terminal CK2. In addition, reference sign "C3" designates a load capacity of the output terminal OUT of the unit shift register SR (that is, the gate line).

A transistor Q3 is connected between the node N1 and the input terminal IN, and the transistor Q3 is a diode-connected transistor (that is, both gate and drain of the transistor Q3 are connected to the input terminal IN). In addition, a transistor Q4 is connected between the node N1 and the first power supply terminal S1, and the gate of the transistor Q4 is connected to the reset terminal RST. The transistor Q3 charges the node N1 based on the signal inputted to the input terminal IN to turn on the transistor Q1, and the transistor Q4 discharges the node N1 based on the signal inputted to the reset terminal RST to turn off the transistor Q1. That is, the transistors Q3 and Q4 constitute the drive circuits to drive the transistor Q1.

Figure 4:
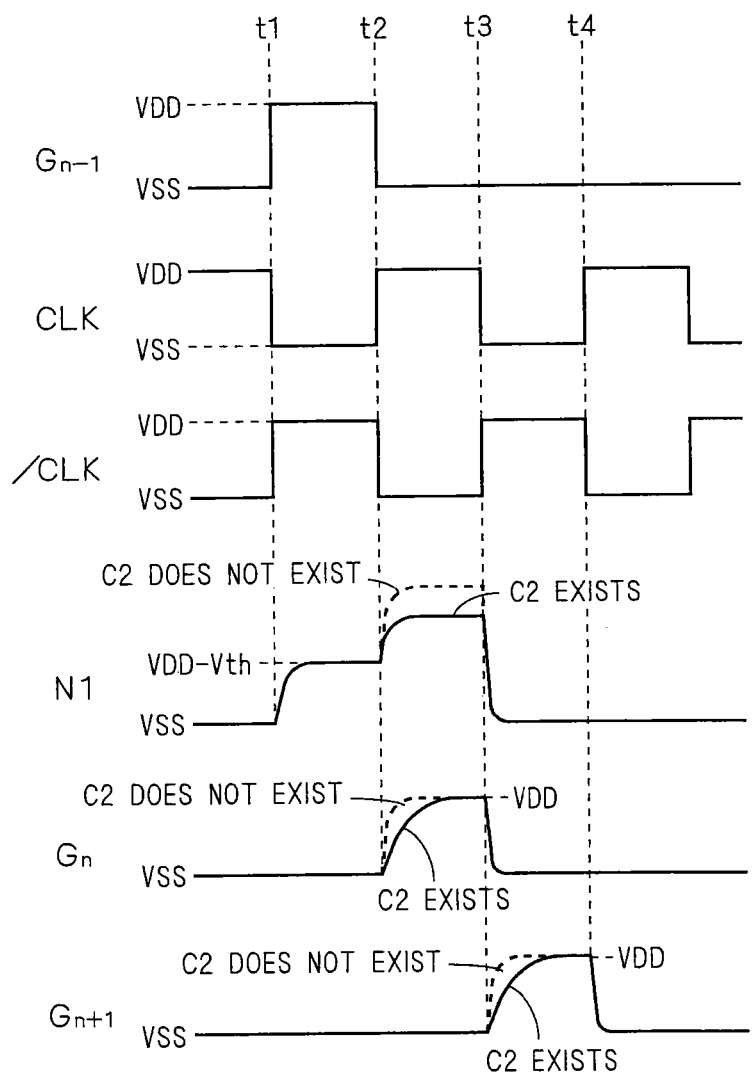
FIG. 4 is a timing chart showing the operation of the conventional unit shift register.

FIG. 4 is a timing chart showing the operation of the conventional unit shift register shown in FIG. 3. The specific operation of the unit shift register SR shown in FIG. 3 will be described with reference to FIG. 4 hereinafter. In addition, since the operation of each unit shift register SR constituting the gate line drive circuit 30 is the substantially the same, the operation of the n-th unit shift register SRn will be described here representatively.

For simplification, the description will be made assuming that the clock signal CLK is inputted to the first clock terminal CK1 of the unit shift register SRn, and the clock signal /CLK is inputted to the second clock terminal CK2 (for example, the unit shift registers $SR_1$ and $SR_3$ shown in FIG. 2 correspond to it). Furthermore, it is defined that an output signal of the unit shift register $SR_n$ is $G_n$ and an output signal of its previous stage (n−1 stage) unit shift register SR is $G_{n-1}$ and an output signal of its next stage (n+1 stage) unit shift register SR is $G_{n+1}$. In addition, it is assumed that all threshold voltages of the transistors constituting the unit shift register $SR_n$ are equal and that value is set to Vth. Furthermore, it is assumed that the potentials of the clock signals CLK and /CLK at H level are equal and the value is set to VDD.

As an initial state, it is assumed that the node N1 is at L level (VSS) (referred to as the "reset state" hereinafter) and the output terminal OUT is also at L level. In addition, it is assumed that the first clock terminal CK1 (clock signal CLK) is at H level and the second clock terminal CK2 (clock signal /CLK), the reset terminal RST (the next stage output signal $G_{n+1}$) and the input terminal IN (previous stage output signal $G_{n-1}$) are all at L level. In this state, since the transistor Q1 is off (cut state), the H level of the first clock terminal CK1 (clock signal CLK) is not transmitted to the output terminal OUT and the output signal $G_n$ is kept at L level. That is, the $GL_n$ connected to this unit shift register $SR_n$ is in a non-selected state.

When it is assumed that the output signal $G_{n-1}$ of the previous stage unit shift register $SR_{n-1}$ becomes H level at a time $t_1$ when the clock signal CLK becomes L level and the clock signal /CLK becomes H level, since accordingly the transistor Q3 of the unit shift register $SR_n$ is turned on, the level of the node N1 becomes H level (VDD−Vth). Thus, when the node N1 is at H level (referred to as the "set state" hereinafter), although the transistor Q1 is turned on, since the clock signal CLK is at L level at this point, the output terminal OUT is kept at L level.

At the following time t2, the clock signal CLK becomes H level and the clock signal /CLK becomes L level. At this time, since the previous stage output signal $G_{n-1}$ returns to L level and the transistor Q3 is turned off, the node N1 becomes H level in a floating state. Thus, since the transistor Q1 is still ON, the H level of the clock signal CLK is transmitted to the output terminal OUT and the level of the output signal $G_n$ rises. At this time, the level of the node N1 rises by a specific voltage due to the coupling through the capacity element C1 and the capacity between the gate and channel of the transistor Q1. Therefore, even when the level of the output terminal OUT rises, since the voltage between the gate and source of the transistor Q1 is kept higher than its threshold voltage (Vth) and the transistor Q1 is maintained at low impedance, the level of the output signal $G_n$ varies, following the level of the first clock terminal CK1 (clock signal CLK). Especially, when the voltage between the gate and source of the transistor Q1 is sufficiently high, since the transistor Q1 performs an operation in a non-saturation region (non-saturation operation), there is no loss in the threshold voltage and the output terminal OUT rises to the same level as that of the clock signal CLK. As a result, the output signal $G_n$ becomes H level (VDD) and the gate line $GL_n$ is activated and becomes a selected state.

Then, when the clock signal CLK becomes L level and the clock signal /CLK becomes H level at a time $t_3$, the level of the output signal $G_n$ becomes L level, following the clock signal CLK and the gate line $GL_n$ returns to non-selected state. In addition, since the next stage output signal $G_{n+1}$ becomes H level at almost the same time, the transistor Q4 is turned on. Therefore, the node N1 becomes L level and the unit shift register $SR_n$ returns to the reset state.

Then, at the following time $t_4$, it is necessary to keep the transistor Q1 OFF so as not to activate the output terminal OUT (output signal $G_n$) unnecessarily until the previous output signal $G_{n-1}$ is inputted. That is, it is necessary to keep the node N1 at L level (that is, the reset state). While the potential of the node N1 is likely to rise when the clock signal CLK rises due to the coupling through its overlap capacity of the gate and drain of the transistor Q1, it is likely to fall when the clock signal /CLK falls due to the coupling through the capacity element C2. Since the levels of the clock signals CLK and /CLK move at the same time, the L level of the node N1 results in being maintained. Thus, according to the unit shift register $SR_n$ shown in FIG. 3, during a period while the output signal $G_n$ is not outputted (referred to as the "non-selected period" hereinafter), since the rise of the node N1 due to the clock signal CLK is negated by the clock signal /CLK, the reset state is maintained. As a result, a defective operation during the non-selected period is prevented.

As described above, the unit shift register $SR_n$ keeps in the reset state in the non-selected period to keep the transistor Q1 OFF and keep the output terminal OUT at L level (VSS) of high impedance. Thus, when the signal (previous stage output signal $G_{n-1}$ or the start pulse SP) is inputted to the input terminal IN, the unit shift register SR is switched to the set state. Since the transistor Q1 is ON in the set state, while the first clock terminal CK1 (clock signal CLK) becomes H level, the output terminal OUT becomes H level and the output signal $G_n$ is outputted. Then, when the signal (next stage output signal $G_{n+1}$) is inputted to the reset terminal RST, it returns to the original reset state.

Figure 5:
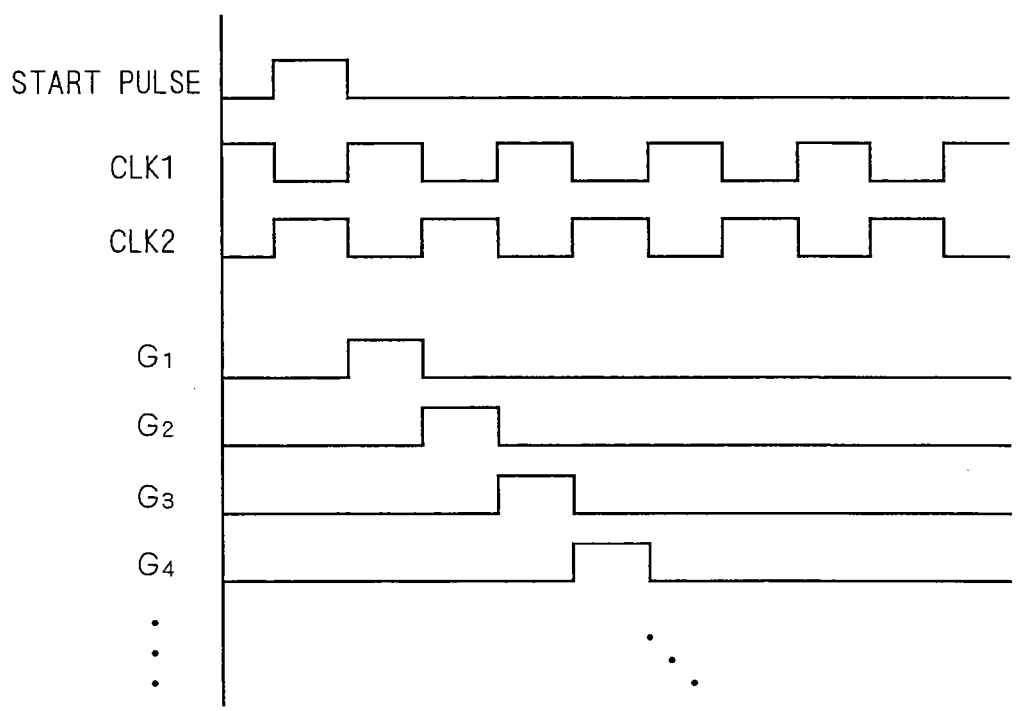
FIG. 5 is a timing chart showing the operation of a gate line drive circuit.

When the plurality of unit shift registers SR operating as described above are cascade-connected as shown in FIG. 2 to constitute the gate line drive circuit 30, the input signal (start pulse SP) inputted to the input terminal IN of the first stage unit shift register $SR_1$ is shifted temporally at the timing synchronized with the clock signals CLK and /CLK and transmitted to the unit shift registers $SR_2$, $SR_3$ ... sequentially as shown in a timing chart in FIG. 5. Thus, the gate line drive circuit 30 can drive the gate lines $GL_1$, $GL_2$, $GL_3$, ... sequentially in the predetermined scan period.

In addition, although the example in which the gate line drive circuit 30 comprising the plurality of unit shift registers SR operates based on the two-phase clock signals has been shown in FIG. 2, it can be operated using a three-phase clock signals. FIG. 6 shows the constitution of a gate line drive circuit 30 in this case.

In this case also, the gate line drive circuit 30 comprises a plurality of cascade-connected unit shift registers SR. That is, the output terminal OUT of the previous stage unit shift register SR is connected to the input terminal IN of the unit shift register SR. However, it is to be noted that a start pulse SP is inputted to the input terminal IN of the first unit shift register SR1 as an input signal.

A clock generator 31 in this case outputs three clock signals CLK1, CLK2, CLK3 having different phases (it is assumed that they are activated in this order). Any two of the signals CLK1, CLK2 and CLK3 are inputted to the first clock terminal CK1 and CK2 of the unit shift register SR. However, it is to be noted that the combination of the two is made such that the rise of the clock signal of the first clock terminal CK1 and the fall of the clock signal of the second clock terminal CK2 occur at the same time so that the potential of the node N1 may not rise due to the clock signal of the first clock terminal CK1 in the non-selected period (for example, when the clock signal CLK1 is inputted to the first clock terminal CK1, the clock signal CLK3 that has become H level just before the clock signal CLK1 is to be inputted to the second clock terminal CK2). In addition, as shown in FIG. 6, the output terminal OUT of the unit shift register of the next stage or two stages after (in the example FIG. 6, two stages after unit shift register) is connected to the reset terminal RST of the unit shift register SR.

In addition, according to the constitutions shown in FIGS. 2 and 6, since the output signal of the latter stage unit shift register SR is inputted to the reset terminal RST of the unit shift register SR, the latter stage unit shift register SR has to be provided so that each unit shift register SR becomes the reset state. Thus, according to the constitution shown in FIG. 2, at least one dummy unit shift register is to be provided next to the final stage unit shift register SR so that the final stage unit shift register SR becomes reset state by the output signal of the dummy stage unit shift register SR. According to the constitution shown in FIG. 6, at least two dummy unit shift register is provided next to the final stage unit shift register SR so that the unit shift register SR of one stage before the final stage becomes the reset state by the output signal of the dummy unit shift register next to the final stage unit shift register SR and the final stage unit shift register SR becomes the reset state by the output signal of the dummy unit shift register of two stages after the final stage unit shift register SR. In addition, since the unit shift register SR cannot perform a normal operation until it becomes the reset state (that is, the above initial state), it is necessary to perform a dummy operation in which a dummy input signal is transmitted from the first stage to final stage and dummy stage of the unit shift registers prior to the normal operation. Alternatively, a transistor for resetting may be separately provided between the node N1 of the unit shift register SR and the first power supply terminal S1 (high potential side power supply) to perform the reset operation in which the node N1 is forcibly discharged prior to the normal operation. However, in this case, it is to be noted that it is necessary to provide a signal line for resetting separately. As this signal for resetting, the start pulse SP to be inputted to the first unit shift register SR1 may be used.

Here, the problem of the defective operation of the unit shift register SR shown in FIG. 3 will be described in detail. According to the unit shift register SR shown in FIG. 3, since the capacity element C2 is connected to the gate (node N1) of the transistor Q1 in order to prevent the potential rise of the node N1 due to the clock signal CLK, the level of the node N1 is prevented from rising due to the above operation in the non-selected period, so that the reset state is maintained. However, the capacity element C2 also prevents the voltage rising of the node N1 when the output signal $G_n$ is outputted (at times $t_2$ to $t_3$ shown in FIG. 4).

For example, when the capacity element C2 is not connected to the node N1, the potential of the node N1 should rise to the higher potential as shown by a dotted line in FIG. 4. In this case, since the drive capability of the transistor Q1 is increased, the output signal $G_n$ sharply rises as shown by a dotted line in FIG. 4, so that the operation can be performed at higher speed. However, when the capacity element C2 is removed from the unit shift register SR, the level of the node N1 rises in the non-selected period due to the clock signal CLK, so that the reset state cannot be maintained and a defective operation occurs.

Thus, according to the unit shift register SR shown in FIG. 3, since the voltage rising effect of the node N1 when the output signal $G_n$ is outputted is reduced, there is a limit in increasing the drive capability of the transistor Q1 (that is, the drive capability of the unit shift register) to speed up the rising rate of the output signal $G_n$, which prevents the operation from being performed at high speed. For example, when the pulse width of the output signal $G_n$ is reduced to speed up the operation of the display, the potential of the gate line cannot rise to a theoretical value (VDD), which lowers a display quality.

A description will be made of a shift register circuit hereinafter according to the present invention in which a defective operation while the output signal is not outputted (that is, in the non-selected period) is prevented and the drive capability while the output signal is outputted is prevented from being lowered.

FIG. 7 is a circuit diagram showing the constitution of a unit shift register SR according to the embodiment 1. As shown in FIG. 7, the output stage of the unit shift register SR comprises a transistor Q1 connected between an output terminal OUT and a first clock terminal CK1, and a transistor Q2 connected between the output terminal OUT and a first power supply terminal S1. That is, the transistor Q1 is an output pull-up transistor (first transistor) in which a clock signal inputted to the first clock terminal CK1 is supplied to the output terminal OUT, and the transistor Q2 is an output pull-down transistor (ninth transistor) in which the output terminal OUT is discharged by supplying the potential of the first power supply terminal S1 to the output terminal OUT. As shown in FIG. 7, it is defined that the node connected to the gate (control electrode) of the transistor Q1 is a node N1. Meanwhile, the gate of the transistor Q2 is connected to the second clock terminal CK2.

Similar to the circuit shown in FIG. 3, a capacity element C1 is provided between the gate and source of the transistor Q1, that is, the node N1 and the output terminal OUT. Reference sign "C3" designates a load capacity of the output terminal OUT (gate line) of the unit shift register SR. However, it is to be noted that the unit shift register SR shown in FIG. 7 does not have the capacity element C2 shown in FIG. 3.

The unit shift register SR shown in FIG. 7 also comprises a drive circuit comprising a diode-connected transistor Q3 (eleventh transistor) connected between the node N1 and the input terminal IN and a transistor Q4 (tenth transistor) connected between the node N1 and the first power supply terminal S1 in which the gate is connected to the reset terminal RST. That is, the transistor Q3 charges the gate (node N1) of the transistor Q1 based on the signal inputted to the input terminal IN, and the transistor Q4 discharges the node N1 based on the signal inputted to the reset terminal RST.

The unit shift register SR according to this embodiment further comprises a transistor Q5 (second transistor) connected between the node N1 and the output terminal OUT, and the gate of the transistor Q5 is connected to the first clock terminal CK1. That is, the transistor Q5 functions as a switching circuit that connects the node N1 to the output terminal OUT based on the signal inputted to the first clock terminal CK1.

Figure 8:
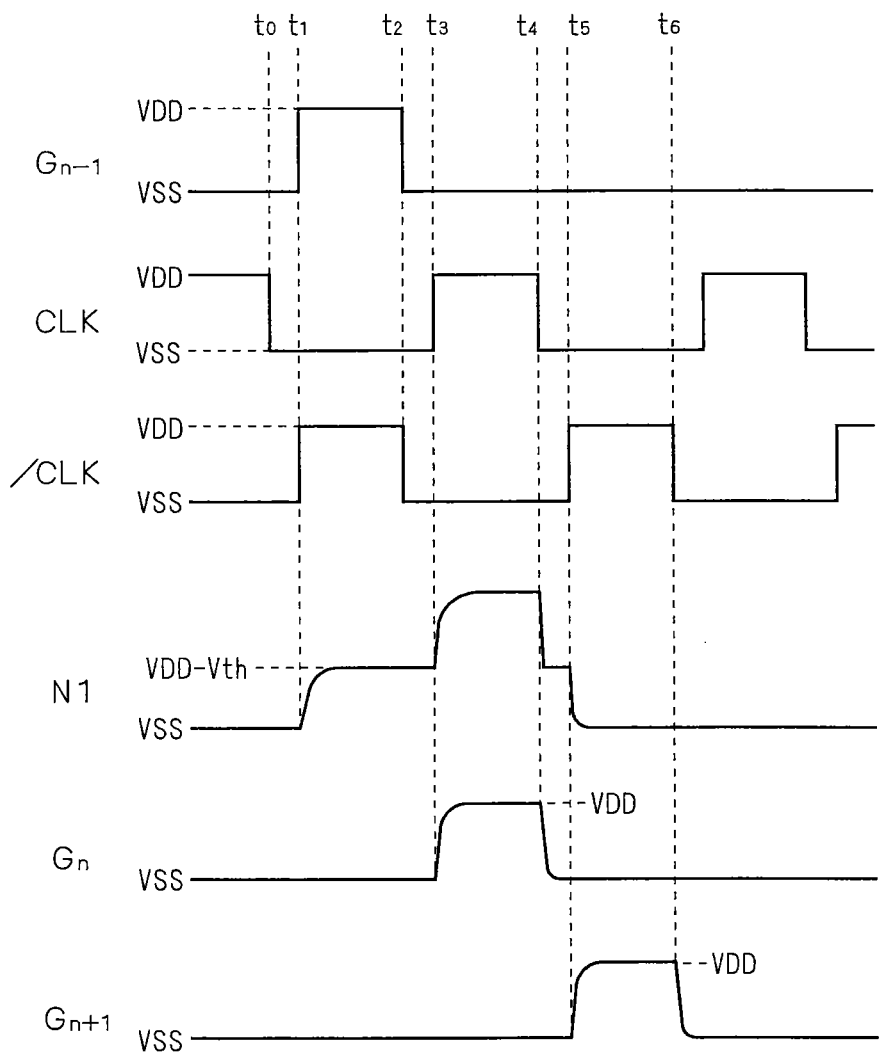
FIG. 8 is a timing chart showing the operation of the unit shift register according to the embodiment 1.

FIG. 8 is a timing chart showing the operation of the unit shift register SR according to the embodiment 1. The operation of the unit shift register SR according to this embodiment shown in FIG. 7 will be described with reference to FIG. 8 hereinafter. Although the unit shift register SR shown in FIG. 7 can be also applied to the gate line drive circuit 30 having the constitutions shown in FIGS. 2 and 6, here, the operation of the cascade-connected unit shift registers SR in a gate line drive circuit 30 like in FIG. 2 will be described.

Here, the operation of the n-th unit shift register $SR_n$ will be described also representatively. In addition, for simplicity, the description will be made assuming that a clock signal CLK is inputted to the first clock terminal CK1 of the unit shift register $SR_n$ and a clock signal /CLK is inputted to the second clock terminal CK2 thereof. In addition, it is defined that an output signal of the unit shift register $SR_n$ is $G_n$ and an output signal of a unit shift register $SR_{n-1}$ of its previous stage (n−1 stage) is $G_{n-1}$ and an output signal of a unit shift register $SR_{n+1}$ of its next stage (n+1 stage) is $G_{n+1}$.

In addition, although the levels of the clock signals CLK and /CLK have to be moved at the same time in the conventional example shown in FIG. 3, there is no need for it in the unit shift register SR shown in FIG. 7 (thus, operation control is easy, which is one of the advantages of the unit shift register SR shown in FIG. 7). Thus, it is assumed that there is a difference in timing of the level shift of the clock signals CLK and /CLK in the following description. In addition, it is assumed that the voltages of the clock signals CLK and /CLK at H level are equal to each other and that value is VDD. Furthermore, it is assumed that the threshold voltage of each transistor Qm is set to Vth (Qm).

(A) Operation when Gate Line is Selected

First, a description will be made of the operation when a previous stage output signal $G_{n-1}$ is inputted into the input terminal IN of the unit shift register SR shown in FIG. 7 and the unit shift register SR outputs an output signal $G_n$ (that is, when a gate line $GL_n$ is activated). FIG. 8 is a timing chart showing the above operation.

It is assumed that the node N1 is at L level (VSS) in an initial state (referred to as the "reset state" hereinafter). It is also assumed that the first clock terminal CK1 (clock signal CLK) is at H level, the second clock terminal CK2 (clock signal /CLK), the reset terminal RST (next stage output signal $G_{n+1}$) and the input terminal IN (previous stage output signal $G_{n-1}$) are all at L level. In this case, since the transistors Q1, Q2 and Q5 connected to the output terminal OUT are all OFF, although the output terminal OUT is in a floating state, it is assumed that the output terminal OUT (output signal $G_n$) is at L level in the initial state.

When the previous stage output signal $G_{n-1}$ becomes H level at a time $t_1$ when the clock signal /CLK becomes H level after the clock signal CLK has become L level at a time to, the transistor Q3 is turned on and the node N1 is charged and becomes H level (VDD−Vth (Q3)). Thus, the transistor Q1 is turned on. At this time, the clock signal CLK is at L level (VSS) and the transistor Q2 is also ON, so that the output signal $G_n$ is maintained at L level.

Then, at a time $t_2$ when the clock signal CLK becomes L level, the previous stage output signal $G_{n-1}$ returns to L level. Then, since the transistor Q3 is turned off, the node N1 becomes floating state, that is, H level. Although at this time the transistor Q2 is turned off, since the transistor Q1 is maintained in ON state and the first clock terminal CK1 (clock signal CLK) is at L level, the output signal $G_n$ is maintained at L level.

Then, at a time $t_3$ when the clock signal CLK becomes H level, since the transistor Q1 is ON, the clock signal CLK is supplied to the output terminal OUT, so that the level of the output signal $G_n$ rises. At this time, the voltage of the node N1 rises in accordance with the rise of the level of the output signal $G_n$ due to capacity coupling through the capacity C1 and the capacity between the gate and channel of the transistor Q1. Therefore, even when the output signal $G_n$ becomes H level, the voltage between the gate and source of the transistor Q1 is highly maintained and the drive capability of the transistor Q1 is ensured. In addition, at this time, since the transistor Q1 operates in non-saturation state, the level of the output terminal OUT (output signal $G_n$) becomes VDD that is the same level as H level of the clock signal CLK, so that the load capacity C3 is charged and the gate line $GL_n$ becomes the selected state.

According to the unit shift register SR shown in FIG. 7, the clock signal CLK is supplied to the gate of the transistor Q5 also. Here, the operation of the transistor Q5 at the time $t_3$, that is, when the output signal $G_n$ rises will be described. FIG. 9 shows the operation and the upper part of the drawing is an enlarged view of the waveforms of the clock signal CLK and the output signal $G_n$ at the time $t_3$ in FIG. 8. The middle part of FIG. 9 shows the voltage $V_{GS}$ (Q5) between the gate and source of the transistor Q5 at that time, that is, the voltage difference between the clock signal CLK and the output signal $G_n$ at the upper part (when the output signal $G_n$ rises, the source of the transistor Q5 is on the side of the output terminal OUT and the drain is on the side of the node N1 from the potential relation). In addition, the lower part in FIG. 9 shows a current I (Q5) flowing in the transistor Q5 at that time.

When the clock signal CLK starts to rise at the time $t_3$ (at a time $t_{30}$ in FIG. 9), the output signal $G_n$ also rises, following it. As shown in the upper part of FIG. 9, since there is a little difference in rising speed between the clock signal CLK and the output signal $G_n$, a voltage difference is generated in both signals from the time $t_{30}$ until the output signal $G_n$ becomes the same level as that of the clock signal CLK at a time $t_{33}$. That is, a voltage $V_{GS}$ (Q5) is applied to between the gate and source of the transistor Q5 as shown in the middle part of FIG. 9 for the times $t_{30}$ to $t_{33}$. Here, when it is assumed that the voltage $V_{GS}$ (Q5) exceeds the threshold voltage Vth (Q5) of the transistor Q5 only for the times t31 to t32, since the transistor Q5 is turned on (conductive state), the current I (Q5) as shown in the lower part of FIG. 9 flows from the node N1 to the output terminal OUT. This current I (Q5) becomes a part of a current to charge the load capacity C3.

As described above, according to the unit shift register SR, although the rise in voltage of the node N1 at the time of the rise of the output signal $G_n$ allows for great drive capability of the transistor Q1, when the current I (Q5) is large, the potential of the node N1 is lowered, which lowers the above effect. Thus, the problem arises similar to that of the conventional circuit shown in FIG. 3. However, since the transistor Q1 is large in size, the output signal $G_n$ rises quickly, following the clock signal CLK, so that the voltage $V_{GS}$ (Q5) is not so high and even if it becomes higher than the threshold voltage Vth (Q5), it is only for a short time. Thus, the current I (Q5) flows only a little and the level lowering of the node N1 that affects the drive capability of the transistor Q1 is not generated. Of course, as long as the voltage $V_{GS}$ (Q5) between the gate and source of the transistor Q5 does not exceed the threshold voltage Vth (Q5), since the transistor Q5 is not turned on, the current I (Q5) does not flow, which does not affect the drive capability of the transistor Q1 at all.

As described above, according to the unit shift register SR in FIG. 7, since the voltage of the node N1 sufficiently rises when the level of the output signal $G_n$ rises, the drive capability of the transistor Q1 can be greatly ensured and the output signal $G_n$ rises at the time $t_3$ at high speed.

When the level of the output signal $G_n$ sufficiently rises (after the time $t_{32}$ shown in FIG. 9), since the transistor Q5 is turned off and a current does not flow (that is, I (Q5)=0), the voltage between the gate and source of the transistor Q1 is maintained and the drive capability of the transistor Q1 is ensured. Therefore, when the clock signal CLK becomes L level at a time $t_4$ (FIG. 8), the output terminal OUT (gate line $GL_n$) is quickly discharged through the transistor Q1 and the output signal $G_n$ returns to L level.

Thus, when the clock signal /CLK becomes H level at a time $t_5$, since the output signal $G_{n+1}$ of the next stage shift register becomes H level, the transistor Q4 is turned on and the node N1 returns to the reset state of L level. Thus, although the transistor Q1 is turned off, since the transistor Q2 is turned on, the output signal $G_n$ is maintained at L level.

(B) Operation of Gate Line in Non-Selected Period

Figure 10:
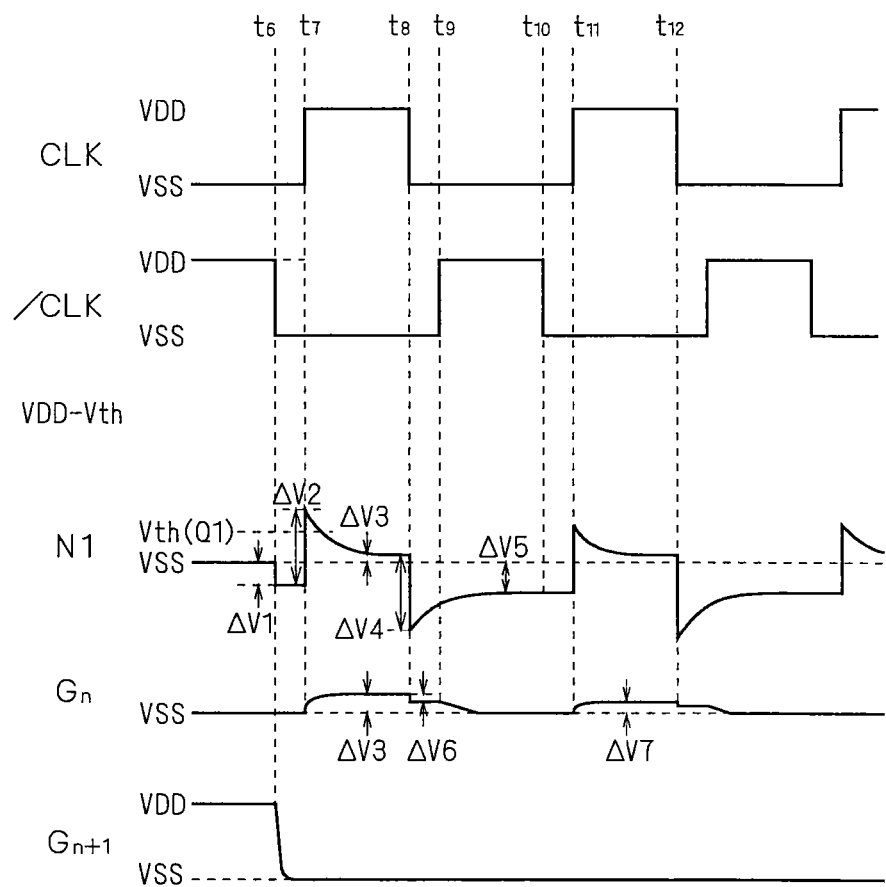
FIG. 10 is a circuit diagram showing the constitution of the unit shift register according to the embodiment 1.

Next, the operation of the unit shift register $SR_n$ in a non-selected period (that is, a period while the gate line $GL_n$ is maintained in an inactive state) will be described. FIG. 10 is a timing chart showing the above operation and each signal waveform while the unit shift register $SR_n$ outputs the output signal $G_n$ and moves to the non-selected period. That is, a time $t_6$ shown in FIG. 10 corresponds to the time $t_6$ in FIG. 8. In addition, as described in FIG. 8, at a time $t_5$, the clock signal /CLK and the next stage output signal $G_{n+1}$ become H level and the node N1 and the output terminal OUT (output signal $G_n$) are at L level.

When the next stage output signal $G_{n+1}$ becomes L level from the above state and the clock signal /CLK becomes L level at a time $t_6$, the transistor Q4 is turned off and the node N1 becomes L level of a floating state. Furthermore, the level of the node N1 is lowered by a specific voltage ($\Delta V1$) due to the coupling through the overlap capacity between the gate and drain of the transistor Q4. In addition, since the transistor Q2 is also turned off at this time, the output terminal OUT becomes L level of the floating state.

Then, when the clock signal CLK becomes H level at a time $t_7$, the level of the node N1 rises by a specific voltage ($\Delta V2$) due to the coupling through the overlap capacity between the gate and drain of the transistor Q1 this time. At this time, when it is assumed that the potential of the node N1 exceeds the threshold voltage Vth (Q1) of the transistor Q1, the transistor Q1 is turned on and a current flows from the first clock terminal CK1 to the output terminal OUT. Then, electric charges are accumulated in the load capacity C3 and the level of the output terminal OUT (output signal $G_n$) starts to rise. However, it is to be noted that since the transistor Q5 is ON (in conductive state) at this time, even when the potential of the node N1 rises, the electric charge is discharged to the load capacity C3 immediately. Thus, even when the transistor Q1 is turned on due to the rise of node N1, it is only for a short time and since the load capacity C3 is relatively large, the rise in level of the output terminal OUT is very small ($\Delta V3$). In addition, the node N1 after discharged by the transistor Q5 becomes the same level as that of the output terminal OUT (higher than VSS by $\Delta V3$).

Then, when the clock signal CLK becomes L level at a time $t_8$, the transistor Q5 is turned off. Since the node N1 is in the floating state, the level of the node N1 is lowered by a voltage ($\Delta V4$) that is almost equal to the above $\Delta V2$ according to the fall of the clock signal CLK due to the coupling through the gate overlap capacity between the gate and drain of the transistor Q1. When the voltages between the gates and sources of the transistors Q3, Q4, and Q5 exceed the threshold voltage (the sources of the transistors Q3, Q4 and Q5 are all on the node N1 side in view of the potential relations) because of the fall in level of the node N1, they are turned on and the level of the N1 rises toward the VSS. Since the level rise of the node N1 ends when the transistors Q3, Q4 and Q5 are all turned off, the potential of the node N1 is lower than the low potential side power supply potential VSS by a minimum value ($\Delta V5$) among the threshold voltages of the transistors Q3, Q4 and Q5. Since the electric charge of the output terminal OUT flows into the node N1 when the transistor Q5 is turned on, the level of the output terminal OUT is lowered by a specific amount ($\Delta V6$).

When the clock signal /CLK becomes H level at a time $t_9$, the transistor Q2 is turned on and the electric charges stored in the load capacity C3 are discharged and the level of the output terminal OUT (output signal $G_n$) is lowered to VSS. Then, when the clock signal /CLK becomes L level at a time $t_{10}$, the transistor Q2 is turned off and the output terminal OUT becomes L level of the floating state.

Although operations for the following times $t_{11}$ to $t_{12}$ are the same as those for the times $t_7$ to $t_8$, since the level ($-\Delta V5$) of the node N1 just before a time $t_{11}$ is lower that that just before the time $t_7$ ($\Delta V5>\Delta V1$), the level of the node N1 is lowered by just that much. Thus, the level rising amount of the output terminal OUT ($\Delta V7$) for the times $t_{11}$ to $t_{12}$ is smaller than that for the times $t_7$ to $t_8$ ($\Delta V7<\Delta V3$).

Thus, after the time $t_{12}$, the operations for the times $t_7$ to $t_{12}$ are repeated until the next selected period of the gate line (that is, until the previous stage output signal $G_{n-1}$ is inputted).

Thus, according to the unit shift register SR shown in FIG. 7, the output signal $G_n$ hardly rises in the non-selected period in which the output signal $G_n$ is not outputted ($\Delta V3$ shown in FIG. 10 at most), so that a defective operation is prevented.

As can be known from the descriptions in (A) and (B), according to the unit shift register in this embodiment, when the output signal $G_n$ is outputted (when the gate line $GL_n$ is selected), since a current does not flow in the transistor Q5, the level of the node N1 sufficiently rises and the drive capability of the transistor Q1 can be highly ensured. Thus, the output signal $G_n$ can rise and fall at high speed, which contributes to high speed of the operation. In addition, in the non-selected period in which the output signal $G_n$ is not outputted, even when the level of the node N1 is going to rise when the clock signal CLK rises, since the transistor Q5 is turned on, the node N1 is discharged and its L level is maintained. Thus, it can be prevented that the transistor Q1 is turned on and the output signal $G_n$ does not unnecessarily become H level in the non-selected period. That is, the unit shift register SR in this embodiment allows for both prevention of a defective operation in the non-selected period and prevention of lowering of the drive capability while the gate line is selected. As a result, operation reliability of the image display comprising the gate line drive circuit 30 having the unit shift register SR can be improved.

As described above, the unit shift register SR according to this embodiment can be applied to the gate line drive circuit 30 having the constitution shown in FIG. 6 and driven by the three-phase clock signals. However, it is to be noted that although the example in which the two stages later output terminal OUT is connected to the reset terminal RST of the unit shift register SR so as to be suitable for the conventional circuit in FIG. 3 is shown in FIG. 6, one stage later (the next) output terminal OUT may be connected to it. As a result, a wiring structure becomes simple (refer to FIG. 11).

Figure 11:
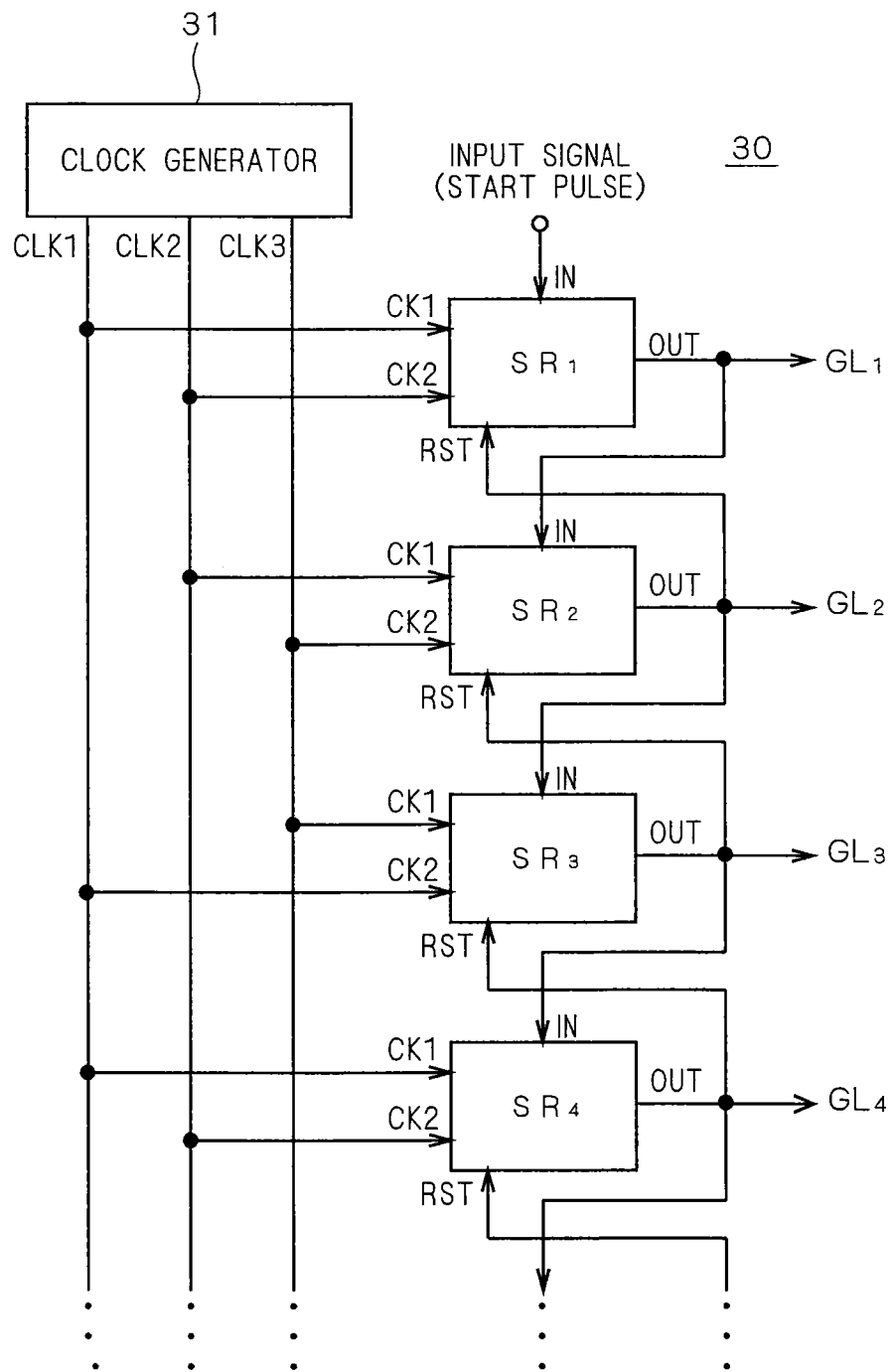
FIG. 11 is a circuit diagram showing the constitution of the unit shift register according to the embodiment 1.

In addition, according to the unit shift register SR in this embodiment, unlike the conventional circuit shown in FIG. 3, the rise of the clock signal of the first clock terminal CK1 does not necessarily conform to the fall of the clock signal of the second clock terminal CK2. Thus, the clock signals inputted to each unit shift register SR may be combined as shown in FIG. 11 (three-phase clock signals CLK1, CLK2, CLK3, CLK1, . . . become H level in this order). That is, the clock signal that will become at H level next may be inputted to the second clock terminal CK2 (for example, when the clock signal CLK 1 is inputted to the first clock terminal CK1, the clock signal CLK2 that will become H level next is inputted to the second clock terminal CK2). In this case, the level of the output terminal OUT that rose a little by the electric charge discharged from the node N1 through the transistor Q5 in the non-selected period ($\Delta V3$ and $\Delta V7$ shown in FIG. 10) is quickly lowered to VSS. Thus, the operation reliability of the unit shift register SR according to this embodiment can be further increased.

Embodiment 2

According to the unit shift register $SR_n$ (FIG. 7) in the embodiment 1, the node N1 is charged by the previous stage output signal $G_{n-1}$. In other words, the output signal $G_n$ of the unit shift register $SR_n$ is used not only for the gate line $GL_n$, but also for charging the node N1 of the next stage unit shift register $SR_{n+1}$.

The capacity component associated with the node N1 of the unit shift register SR includes the capacity of the capacity element C1 and the gate capacity of the transistor Q1. According to the embodiment 1, the capacity component becomes a part of the load capacity C3 of the output terminal OUT of the unit shift register SR, which causes the rising speed of the output signal to be lowered. This prevents the high-speed operation of the unit shift register SR.

Figure 12:
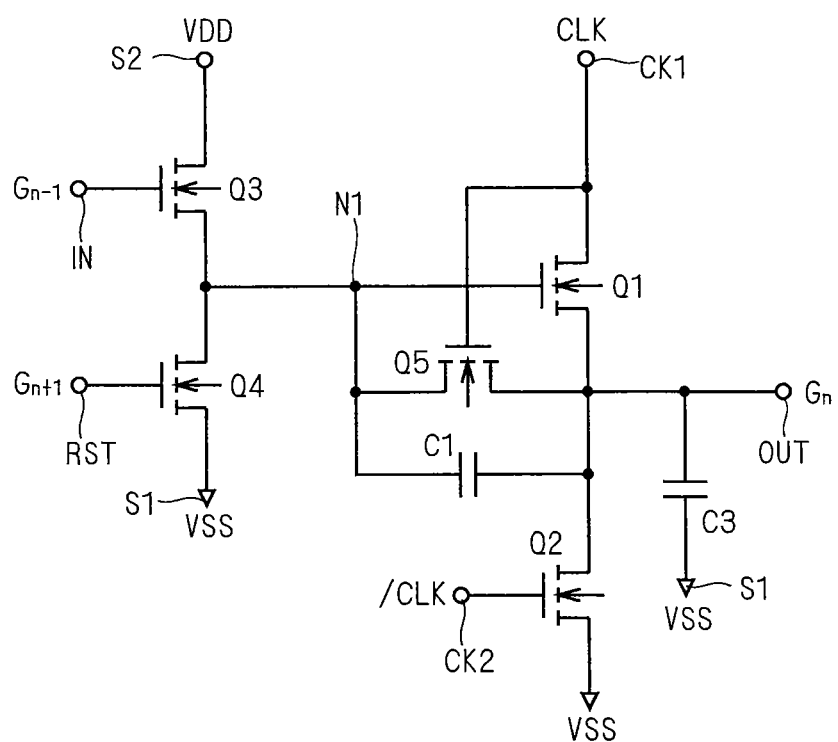
FIG. 12 is a circuit diagram showing the constitution of a unit shift register according to an embodiment 2.

According to an embodiment 2, a unit shift register SR that can solve the above problem is proposed. FIG. 12 is a circuit diagram of the unit shift register SR. As shown in FIG. 12, according to the unit shift register SR in this embodiment, the gate of a transistor Q3 constituting a drive circuit is connected to an input terminal IN, and a drain is connected to a second power supply terminal S2 to which a predetermined high potential side power supply potential VDD is supplied. That is, according to this embodiment, the node N1 is not charged by the previous stage output signal $G_{n-1}$, but charged by the power supply that supplies the high potential side power supply potential VDD. Except for this, it has the same constitution as that of the unit shift register SR in the embodiment 1 (FIG. 7).

The output terminal OUT of the unit shift register SR is connected to a gate line GL and the gate of the transistor Q3. Since the gate capacity of the transistor Q3 is $\frac{1}{10}$ of the capacity component associated with the node N1 (capacity of a capacity element C1 and the gate capacity of the transistor Q3) or less, the load capacity of the output terminal OUT of the unit shift register SR is smaller than that in the embodiment 1. Therefore, the rising speed and falling speed of the output signal can be prevented from being lowered and the above problem can be solved.

In addition, although the unit shift register SR shown in FIG. 12 is different from the circuit shown in FIG. 7 in that the node N1 is charged by the power supply that supplies the high potential side power supply potential VDD, its operation is the same. Therefore, the same effect as that in the embodiment 1 can be provided in this embodiment.

In addition, according to the unit shift register SR shown in FIG. 12, since the drain potential of the transistor Q3 is VDD even in the non-selective period, although there is concern that an electric charge is supplied to the node N1 at L level of a floating state by a leak current of the transistor Q3, this concern is no problem because a transistor Q5 is periodically turned on in synchronization with the clock signal CLK and the electric charge is discharged.

In addition, according to the unit shift register SR in the embodiment 1 (FIG. 7), since a wiring for supplying the high potential side power supply potential VDD is not needed, the area occupied by the circuit can be reduced, which contributes to high integration of the gate line drive circuit.

Embodiment 3

A display in which a shift register of a gate line drive circuit comprises an amorphous silicon TFT (a-Si TFT) is easy to be enlarged and has high productivity, so that it is widely used as a screen of a notebook personal computer or a big screen display.

Meanwhile, it has been known that when the gate electrode of the a-Si TFT is continuously positively biased, its threshold voltage shifts in a positive direction and its drive capability is lowered. For example, according to the circuit of the embodiment 1 (FIG. 7), since the clock signal /CLK is repeatedly inputted to the gate of the transistor Q2, there is concern that the threshold voltage of the transistor Q2 shifts and its drive capability is lowered and the output terminal OUT cannot be discharged. Thus, the electric charge that should be discharged from the node N1 through the transistor Q5 in the non-selected state is accumulated in the output terminal OUT and a defective operation in which the gate line GL to be inactive is activated is generated at the end. An embodiment 3 proposes a unit shift register SR that can solve the above problem.

Figure 13:
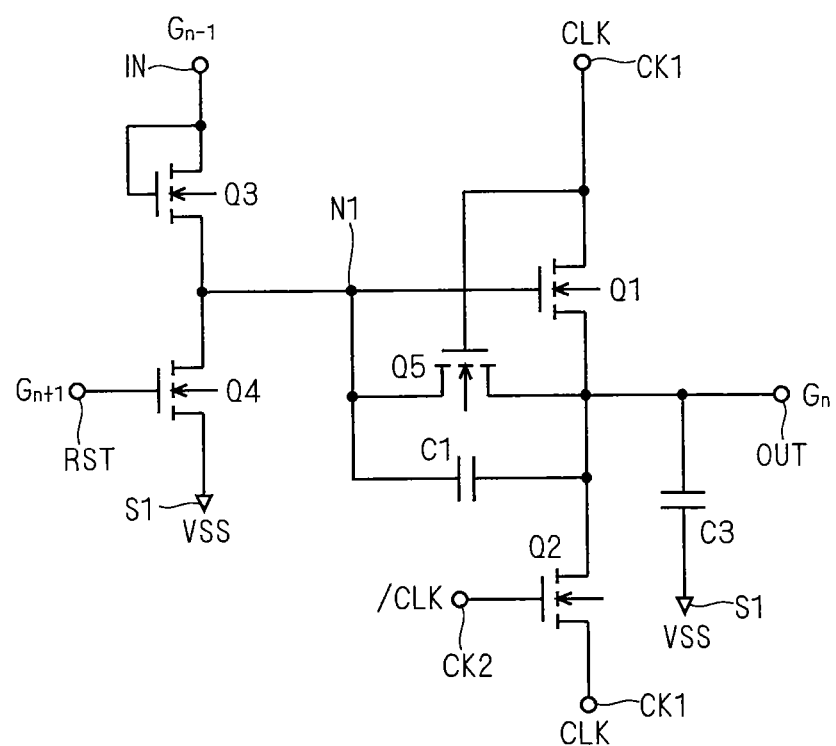
FIG. 13 is a circuit diagram showing the constitution of a unit shift register according to an embodiment 3.

FIG. 13 is a circuit diagram showing the constitution of the unit shift register according to the embodiment 3. As shown in FIG. 13, the source of a transistor Q2 is connected to a first clock terminal CK1. That is, the main electrode (drain) of the transistor Q2 is connected to an output terminal OUT and a clock signal CLK having a phase different from that of a clock signal /CKL to be inputted to a control electrode (gate) is supplied to another main electrode (source).

According to this constitution, when the clock signal /CLK inputted to the gate of the transistor Q2 becomes L level and the transistor Q2 is turned off, since the clock signal CLK inputted to the source becomes H level, a state equivalent to a case where the gate of the transistor Q2 is negatively biased with respect to the source is provided. Thus, since a threshold voltage that shifted in the positive direction returns in the negative direction and makes a recovery, there is an effect that the drive capability of the transistor Q2 is prevented from being lowered and the operation life of the circuit can be elongated.

In addition, although the description has been made assuming that the gate line drive circuit 30 comprising a unit shift register SR is driven by a two-phase clock signals, this embodiment can be applied to a unit shift register SR of a gate line drive circuit 30 driven by three-phase clock signals. In this case, either one of the two clock signals other than that inputted to the gate of the transistor Q2 may be inputted to the source of the transistor Q2. In addition, this embodiment can be applied to the circuit in the embodiment 2 (FIG. 12).

Embodiment 4

According to the unit shift register SR in the above each embodiment, the potential of the node N1 at the time of moving to the set state rises to VDD−Vth (Q3) theoretically by the charging (precharge) of the transistor Q3. However, since charging speed of the node N1 is not relatively high, when the frequency of the clock signal becomes high and the pulse width of the input signal (previous stage output signal) becomes narrow, it is hard for the node N1 to reach the maximum precharge level (VDD−Vth(Q3)). Reason for that includes the fact that the transistor Q3 operates in a source follower mode at the time of the precharging of the node N1. That is, when the level of the node N1 rises, since the voltage between the gate and source of the transistor Q3 is lowered, while the node N1 is charged, the drive capability of the transistor Q3 is lowered and the rising speed of the level is considerably lowered.

Figure 14:
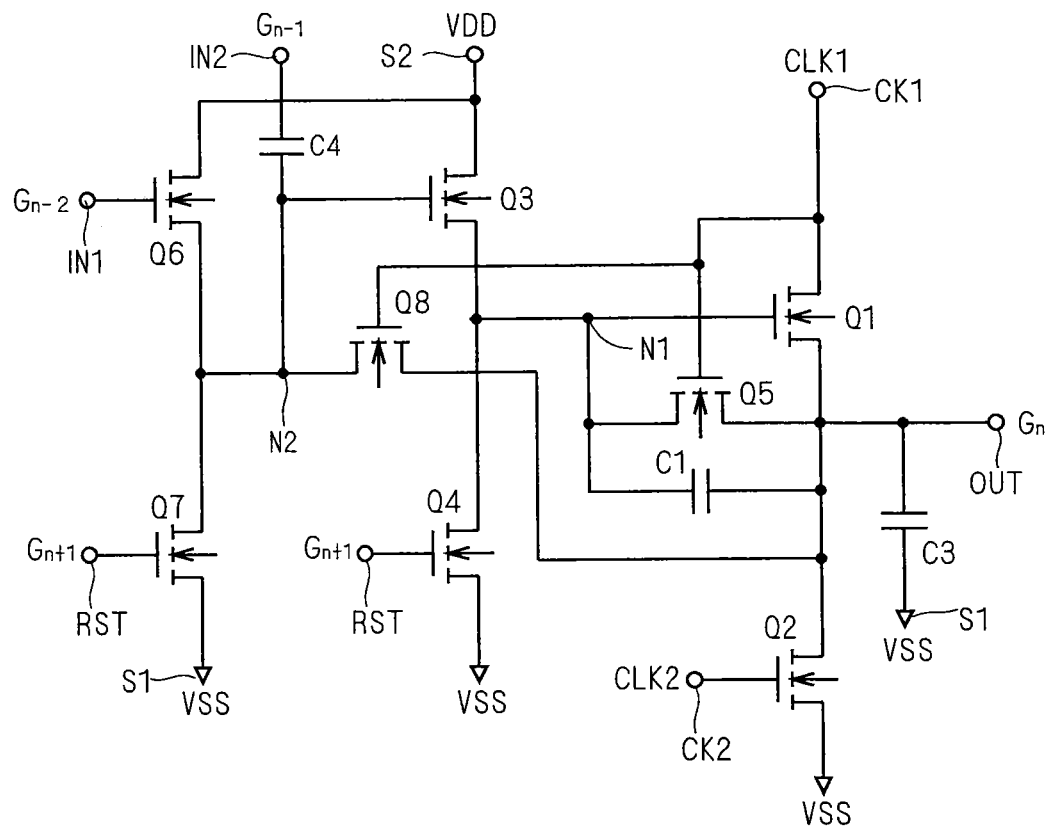
FIG. 14 is a circuit diagram showing the constitution of a unit shift register according to an embodiment 4.

An embodiment 4 proposes a unit shift register SR that can solve the above problem. FIG. 14 is a circuit diagram showing the constitution of the unit shift register SR according to the embodiment 4. According to the unit shift register SR, a drive circuit for driving a transistor Q1 comprises transistors Q6 and Q7 and a capacity element C4 in addition to transistors Q3 and Q4.

Similar to the circuit of the embodiment 2 (FIG. 12), the transistor Q3 is connected between the node N1 and a second power supply terminal S2, and the transistor Q4 is connected between the node N1 and a first power supply terminal S1. Similar to the circuit in FIG. 12 also, the gate of the transistor Q4 is connected to a reset terminal RST. However, unlike the circuit in FIG. 12, a previous stage output signal $G_{n-1}$ is not directly inputted to the gate of the transistor Q3.

The unit shift register SR according to this embodiment has two input terminals such as a first input terminal IN1 and a second input terminal IN2. When it is defined that the gate node of the transistor Q3 is a node N2, the transistor Q6 whose gate is connected to the first input terminal IN1 is connected between the node N2 and the second power supply terminal S2. In addition, the capacity element C4 is connected between the node N2 and the second input terminal IN2. Furthermore, the transistor Q7 whose gate is connected to the reset terminal RST is connected between the node N2 and the first power supply terminal S1.

In addition, the transistor Q8 whose gate is connected to a first clock terminal CK1 is connected between the node N2 and the output terminal OUT and it is a transistor for preventing the node N2 from becoming a floating state.

When a gate line drive circuit 30 is constituted by the unit shift register SR shown in FIG. 14, the plurality of unit shift registers SR are cascade-connected as shown in FIG. 15. Three-phase clock signals generated from a clock generator 31 are controlled such that CLK1, CLK2, CLK3, CLK1, . . . are activated in this order.

As shown in FIG. 15, first and second start pulses SP1 and SP2 are inputted to the first and second input terminals IN1 and IN2 of the first stage unit shift register SR1 as input signals, respectively. The first and second start pulses SP1 and SP2 are signals that become H level at the timing corresponding to the head of each frame of an image signal but the phases of them are shifted. That is, the first start pulse SP1 becomes H level at a timing earlier than that of the second start pulse SP2, and the second start pulse SP2 is controlled to become H level after the first start pulse SP1 has returned to L level.

According to a second stage unit shift register SR2, the second start pulse SP2 is inputted to a first input terminal IN1, and a second input terminal IN2 is connected to the output terminal OUT of the first stage unit shift register SR1. According to a third stage or later unit shift register SR, a first input terminal IN1 is connected to the output terminal OUR of the previous stage unit shift register SR and a second input terminal IN2 is connected to the output terminal OUT of the two stages before unit shift register SR. In addition, the reset terminal RST of each unit shift register SR is connected to the next stage output terminal OUT.

FIG. 16 is a timing chart showing the operation of the unit shift register SR according to this embodiment. A description will be made of the operation of an n-th unit shift register $SR_n$ assuming that the clock signal CLK1 is inputted to its first clock terminal CK1 and the clock signal CLK2 is inputted to its second clock terminal CK2 (for example, it corresponds to the unit shift registers SR1 and SR4 in FIG. 15).

In addition, it is defined that the a gate drive signal outputted from the unit shift register SR is $G_n$, and output signals of the previous stage and two stages before unit shift registers SR are $G_{n-1}$ and $G_{n-2}$, respectively, and a gate line drive signal outputted from the next stage unit shift register SR is $G_{n+1}$. In addition, to simplify the description, it is assumed that H levels of the clock signals CLK1, CLK2, CLK3, the first start pulse SP1 and the second start pulse SP2 are equal to each other and the level is equal to a high potential side power supply potential VDD.

As an initial state, it is assumed that the node N1 and the node N2 are at L level (VSS) (referred to as the "reset state" hereinafter). In addition, it is assumed that the first clock terminal CK1 (clock signal CLK1) is at H level and the clock signals CLK2 and CLK3, the first input terminal IN1 (two stages before output signal $G_{n-2}$), the input terminal IN2 (previous stage output signal $G_{n-1}$), and the reset terminal RST (next stage output signal $G_{n+1}$) are all at L level.

It is assumed that when the clock signal CLK2 becomes H level at a time $t_1$ after the clock signal CLK1 has become L level at a time $t_0$, the two stages before output signal $G_{n-2}$ (the first start pulse SP1 in the case of the first unit shift register SR1) becomes H level. Thus, since the transistor Q6 of the unit shift register $SR_n$ is turned on, the node N2 is charged and becomes H level. In addition, the transistor Q3 is turned on according to it and the level of the node N1 rises.

Here, although it is necessary to charge the capacity element C4 and the capacity between the gate and channel (gate capacity) of the transistor Q3 to raise the level of the node N2, since the sum of the capacity values is small (for example, it is about ⅕ to 1/10 of the sum of the capacity element C1 and the gate capacity of the transistor Q1 connected to the node N1), the node N2 can be charged at high speed. Thus, even when the transistor Q6 operates in the source follower mode in which high-speed charging is difficult, the level of the node N2 rises to a theoretical value (VDD−Vth (Q6)) at high speed.

Meanwhile, although it is necessary to charge the capacity element C1 and the gate capacity of the transistor Q1 to raise the level of the node N1, since those capacity values are relatively great, it is difficult to charge the node N1 at high speed. Furthermore, since the transistor Q3 operates in the source follower mode, it is difficult to raise the level of the node N1 to a theoretical value (VDD−Vth (Q6)−Vth (Q3)) for a short time. Therefore, unless the pulse width of the two stages before output signal $G_{n-2}$ is sufficiently large, the level of the node N1 at this time rises only a constant level smaller than the theoretical value.

Since the two stages before output signal $G_{n-2}$ returns to L level when the clock signal CLK2 returns to L level at a time $t_2$, the transistor Q6 is turned off and the node N2 becomes H level of a floating state.

Then, when the clock signal CLK3 becomes H level at a time $t_3$, since the previous stage output signal $G_{n-1}$ (the second start pulse SP2 in the case of the first unit shift register SR1) becomes H level, the precharged node N2 further rises due to the coupling through the capacity element C4 of the unit shift register SR. The node N2 after the level has risen is higher than that before the level rise by the amplitude (VDD) of the previous stage output signal $G_{n-1}$, it becomes 2×VDD−Vth (Q6).

In this state, since the voltage between the gate (node N2) and source (node N1) of the transistor Q3 is sufficiently high, the transistor Q3 charges the node N1 not in the source follower mode but in the operation in a non-saturation region (non-saturation operation). Thus, the node N1 is charged at high speed and becomes H level, and the node N1 reaches VDD level without any loss in the threshold voltage Vth. When the node N1 and the node N2 are at H level (referred to as the "set state" hereinafter), the transistor Q1 is turned on.

When the clock signal CLK3 returns to L level at a time $t_4$, the previous stage output signal $G_{n-1}$ returns to L level and the level of the gate (node N2) of the transistor Q3 falls, following it and returns to VDD−Vth (Q6) before the level rises. At this time, since the level of the source (node N1) of the transistor Q3 is VDD, the transistor Q3 is turned off and the node N1 becomes floating H level (therefore, the set state is maintained).

According to the unit shift register SR in each embodiment described above, since the loss in the threshold voltage of the transistor Q3 is accompanied at the time of precharging of the node N1, even when the pulse width of the clock signal is sufficiently large, the node N1 only rises to VDD−Vth (Q3) at most. Meanwhile, according to this embodiment, the node N1 can be charged to the level higher than that by Vth (Q3) or more even for a short time.

Thus, when the clock signal CLK1 of the first clock terminal CK1 becomes H level at a time $t_5$, since the transistor Q1 is ON and the transistor Q2 is OFF at this time, the level of the output signal $G_n$ of the output terminal OUT rises. Then, the level of the node N1 rises due to the capacity coupling through the capacity element C1 and the gate capacity of the transistor Q1 by a specific voltage. Thus, since the voltage between the gate and source of the transistor Q1 is largely maintained, the level of the output terminal OUT, that is, the output signal $G_n$ rises at high speed, following the clock signal CLK1. In addition, since the transistor Q1 operates in the non-saturation region, the H level of the output signal $G_n$ is VDD that is the same level of the H level of the clock signal CLK1.

In this embodiment also, there is a case where the voltage ($V_{GS}$ (Q5)) between the gate and source of the transistor Q5 exceeds its threshold voltage (Vth (Q5)) due to the difference between the rising speed of the clock signal CLK1 and the rising speed of the output signal $G_n$ like the embodiment 1 and a current (I (Q5)) flows from the node N1 to the output terminal OUT when the output signal $G_n$ rises (refer to FIG. 9). However, since the current is small basically and the level of the node N1 is not lowered to affect the drive capability of the transistor Q1, it is no problem. Especially, in this embodiment, since the level of the node N1 is high and the rising speed of the output signal $G_n$ is higher than that of the embodiment 1, the voltage between the gate and source of the transistor Q5 is low.

Thus, when the clock signal CLK1 returns to L level at a time $t_6$, the output signal $G_n$ also returns to L level and the gate line returns to the non-selected state. At this time, the level of the node N1 is lowered to the previous state of VDD.

Then, when the clock signal CLK2 becomes H level at a time $t_7$, the next stage output signal $G_{n+1}$ becomes H level. Accordingly, the transistors Q4 and Q7 are turned on and the nodes N1 and N2 return to L level of the reset state. Thus, although the transistor Q1 is turned off, since the transistor Q2 is turned on at this time, the L level of the output signal $G_n$ is maintained. Then, when the clock signal CLK2 returns to L level at a time $t_8$, the next stage output signal $G_{n+1}$ returns to L level and then the unit shift register $SR_n$ enters a non-selected period.

In addition, the operation in the non-selected period is almost the same as that in the embodiment 1 basically, and every time the clock signal CLK1 is inputted to the first clock terminal CK1, the transistor Q5 is turned on (conductive state). Thus, even when the level of the node N1 is going to rise when the clock signal CLK1 rises, the node N1 is discharged through the transistor Q5, so that its L level is maintained. Furthermore, in this non-selected period, the transistor Q8 is also turned on every time the clock signal CLK1 is inputted and the node N2 is discharged. Thus, the electric charge due to the leak current of the transistor Q6 is stored in the node N2 and the node N2 is prevented from becoming H level. Thus, the transistors Q5 and Q8 prevent the transistor Q1 from being turned on and prevent the output signal $G_n$ from becoming H level unnecessarily in the non-selected time.

Thus, according to this embodiment, as compared with the above each embodiment, since the node N1 can be precharged to higher level at higher speed, the rising and falling speed of the output signal can be more improved, which contributes to the high speed of the operation. In addition, since the transistor Q5 operates similar to the embodiment 1, the effect that the defective operation is prevented in the non-selected period can be provided like in the embodiment 1. Furthermore, the embodiment 3 can be applied to this embodiment.

Embodiment 5

As described above with reference to FIG. 9, according to the unit shift register SR in the embodiment 1, when the voltage $V_{GS}$ (Q5) between the gate and source of the transistor Q5 exceeds its threshold voltage Vth (Q5) at the time of rising of the output signal ($G_n$), the current (I (Q5)) flows from the node 1 to the output terminal OUT through the transistor Q5. As described above, since the current is small and the level of the node N1 is not lowered to affect the drive capability of the transistor Q1, it is no problem, but when the output load capacity is large and the rising speed of the output signal is slow, the current (I (Q5)) flowing the transistor Q5 is increased and the drive capability of the transistor Q1 could be lowered. An embodiment 5 proposes a unit shift register SR to solve the above problem.

Figure 17:
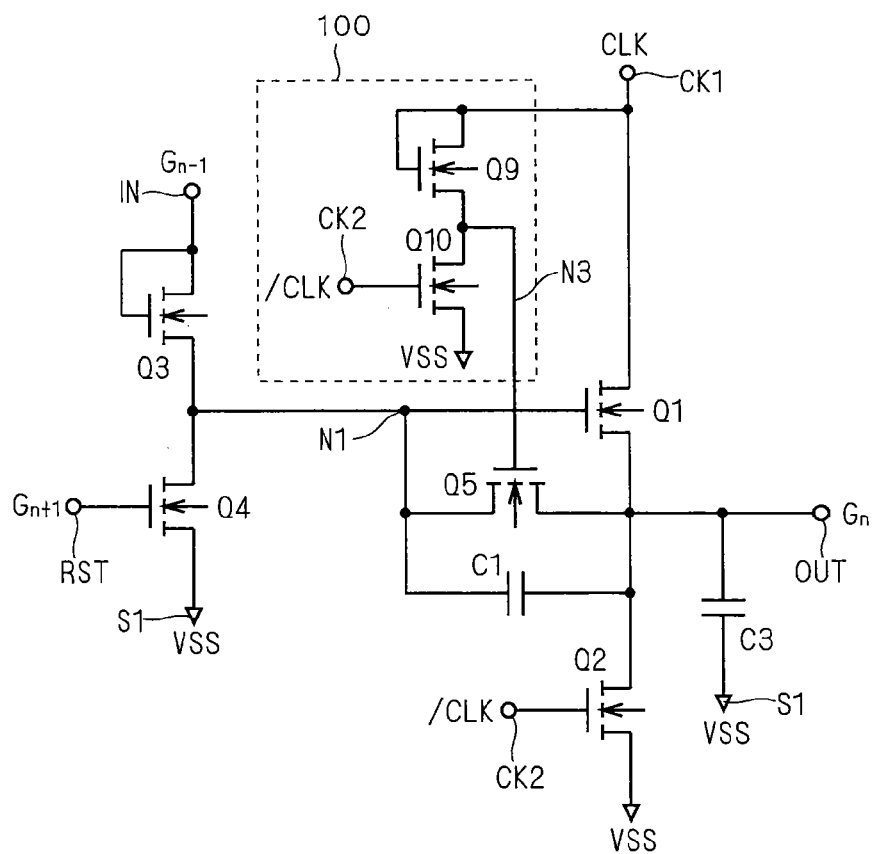
FIG. 17 is a circuit diagram showing the constitution of a unit shift register according to an embodiment 5.

FIG. 17 is a circuit diagram showing the unit shift register according to the embodiment 5. According to the unit shift register SR shown in FIG. 17, the gate of a transistor Q5 and a first clock terminal CK1 are not directly connected and a level adjustment circuit 100 is interposed therebetween. The level adjustment circuit 100 lowers the H level of a clock signal inputted to the first clock terminal CK1 by a predetermined value (reduces the absolute value of the H level based on L level) and then supplies it to the gate of the transistor Q5. That is, the level adjustment circuit 100 functions to reduce the amplitude of the clock signal inputted to the first clock terminal CK1 by the predetermined value.

The level adjustment circuit 100 in the example shown in FIG. 17 comprises transistors Q9 and Q10. When it is assumed that the node connected to the gate of the transistor Q5 is defined as node N3, the transistor Q9 (third transistor) is connected between the node N3 and the first clock terminal CK1 and its gate is connected to the first clock terminal CK1 (diode connected transistor). In addition, the transistor Q10 (fourth transistor) is connected between the node N3 and a first power supply terminal S1 and its gate is connected to a second clock terminal CK2.

The operation of the unit shift register SR in the embodiment 5 will be described hereinafter. Here, it is assumed that the unit shift register SR is driven by two-phase clock signals CLK and /CLK and the clock signal CLK is inputted to the first clock terminal CK1 and the clock signal /CLK is inputted to the second clock terminal CK2.

Although the operation of the unit shift register SR shown in FIG. 17 is basically the same as that of the circuit of the embodiment 1 (FIG. 7), the clock signal CLK is supplied to the gate of the transistor Q5 through the level adjustment circuit 100. When the clock signal CLK becomes H level, a signal whose level is reduced from the H level of the clock signal CLK by the threshold voltage of the transistor Q9, that is, a signal whose level is reduced from the amplitude of the clock signal CLK by the threshold voltage is supplied to the gate of the transistor Q5 (at this time, the clock signal /CLK is at L level and the transistor Q10 is OFF).

As a result, the voltage ($V_{GS}$ (G5)) between the gate and source of the transistor Q5 at the time of the rising of the output signal ($G_n$) is lowered and it is not likely to exceed its threshold voltage (Vth (Q5)). Thus, even when the output load capacity is large and the rising of the output signal is delayed, a current (I (Q5)) flowing in the transistor Q5 at that time is small or can be zero, so that the drive capability of the transistor Q1 can be prevented from being lowered.

In addition, since transistor Q9 functions as a diode in which the first clock terminal CK1 is an anode and the node N3 is cathode (that is, a conducting direction (charge direction) is from the first clock terminal CK1 to the node N3), when the clock signal CLK returns to L level, the node N3 of the transistor Q9 cannot be discharged. However, since the clock signal /CLK becomes H level at this time, the node N3 is discharged through the transistor Q10 and becomes L level. As a result, the transistor Q5 operates almost similar to the embodiment 1.

Embodiment 6

An embodiment 6 shows a variation of the level adjustment circuit 100 described in the embodiment 5.

Figure 18:
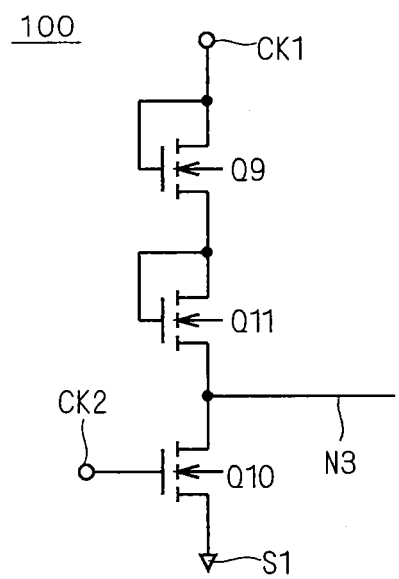
FIG. 18 is a circuit diagram showing a variation of a level adjustment circuit according to an embodiment 6.

For example, in a case where the current flowing in the transistor Q5 cannot be sufficiently prevented at the time of the rising of the output signal $G_n$ of the unit shift register SR even using the level adjustment circuit 100, a level adjustment circuit 100 in which two diode-connected transistors Q9 and Q10 connected between a node N3 and a first clock terminal CK1 in series may be used as shown in FIG. 18. Since the H level of the signal supplied to the gate of the transistor Q5 is reduced by the threshold voltage of the transistor Q11 as compared with the level adjustment circuit 100 shown in FIG. 17, the current flowing in the transistor Q5 can be further effectively prevented.

Figure 19:
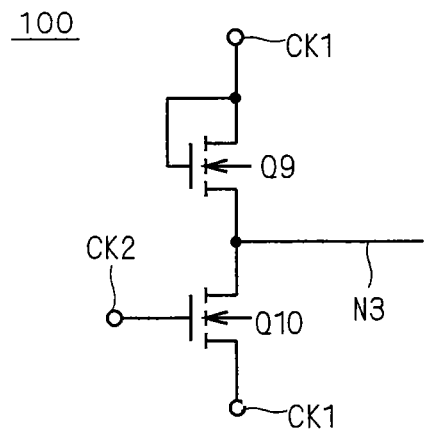
FIG. 19 is a circuit diagram showing a variation of the level adjustment circuit according to the embodiment 6.

In addition, although the source of the transistor Q10 is connected to the first power supply terminal S1 in FIG. 17, it may be connected to the first clock terminal CK1 as shown in FIG. 19. In this case, when the clock signal /CLK becomes L level and the transistor Q10 is turned off, since the clock signal CLK inputted to the source becomes H level, the same state equivalent to a case where the gate of the transistor Q10 is negatively biased with respect to the source is provided. Thus, since the threshold voltage of the positively shifted transistor Q10 returns to the negative direction and makes a recovery, the operation life of the circuit can be elongated.

In addition, in the unit shift register SR shown in FIG. 17, when the gate width of the transistor Q5 is large and its gate capacity is considerably large compared with the parasitic capacity (not shown) associated with the node N3, it is considered that the level of the node N3 rises due to the coupling through the overlap capacity between the gate and drain of the transistor Q5 at the time of the rising of the output signal $G_n$. When the level of the node N3 highly rises, the transistor Q5 is turned on while the output signal $G_n$ is at H level, which causes the level of the node N1 to be lowered.

Thus, as shown in FIG. 20, a diode-connected transistor Q12 (one-way switching element) in which a forward direction (discharge direction) is from the node N3 to the first clock terminal CK1 may be provided between the node N3 and the first clock terminal CK1 in a level adjustment circuit 100. According to the transistor Q12, when the level of the node N3 rises more than the sum of the H level (VDD) of the clock signal CLK and the threshold voltage (Vth (Q12)) of the transistor Q12, a current flows from the node N3 to the first clock terminal CK1 to clamp the level of the node N3 at the VDD+Vth (Q12) level. Therefore, since the voltage between the gate and source of the transistor Q5 is Vth (Q12) at most, the conduction of the transistor Q5 at the time of the output of the output signal $G_n$ can be prevented, so that the level of the node N1 is also prevented from being lowered.

In addition, although the transistor Q12 is provided in the level adjustment circuit 100 shown in FIG. 17 as shown in FIG. 20, the transistor Q12 may be provided in the level adjustment circuit 100 shown in FIG. 18 as shown in FIG. 21 or it may be provided in the level adjustment circuit 100 shown in FIG. 19 as shown in FIG. 22.

Embodiment 7

FIG. 23 is a circuit diagram showing a unit shift register SR according to an embodiment 7 of the present invention. This embodiment is effective in the case where the power supply for supplying the high potential side power supply potential VDD is used as a charging power supply of the node N1 through the transistor Q3 like the embodiment 2 (FIG. 12).

For example, in the non-selected period of the unit shift register SR in FIG. 12, when the clock signal CLK is at L level, the transistor Q5 is OFF and the node N1 is at L level of the floating state, so that the electric charges due to the leak current of the transistor Q3 are stored in the node N1. Thus, the potential of the node N1 rises when the leak current is large. When the clock signal CLK becomes H level, the level of the node N1 rises due to coupling through the overlap capacity of the transistor Q1. However, when the level of the node N1 at that time is high, the transistor Q1 is likely to be turned on even in the non-selected period, and a defective operation could be generated.

The unit shift register SR shown in FIG. 23 is provided to solve the above problem. The unit shift register will be described hereinafter.

According to the unit shift register SR shown in FIG. 23, a circuit comprising transistors Q13 to Q15 is connected to the circuit shown in FIG. 12. As shown in FIG. 23, the transistor Q13 is connected between a node N1 and a first power supply terminal S1. Here, when it is defined that the node connected to the gate of the transistor Q13 is a node N4, the transistors Q14 and Q16 are connected in parallel between the node N4 and the first power supply terminal S1. The gate of the transistor Q14 is connected to the node N1 and the gate of the transistor Q16 is connected to a first clock terminal CK1. In addition, the transistor Q15 is a diode-connected transistor and connected between the node N4 and a second clock terminal CK2. That is, the gate and drain of the transistor Q15 are connected to the second clock terminal CK2.

The on resistance of the transistor Q14 is sufficiently smaller than that of the transistor Q15. Therefore, in a case where it is assumed that a clock signal /CLK is at H level, when the node N1 becomes H level and the transistor Q14 is turned on, the node N4 becomes L level. That is, the transistors Q14 and Q15 constitute a ratio inverter in which the node N1 is an input node and the node N4 is an output node, and the transistor Q14 (sixth transistor) functions as a driver element of the inverter and the transistor Q15 (seventh transistor) functions as a load element. However, since in this inverter, the clock signal /CLK is used as a power supply to be supplied to the drain of the transistor Q15, the inverter is activated while the clock signal /CLK is at H level.

The transistor Q16 is turned on when the clock signal CLK is at H level, and discharges the node N4. That is, the transistor Q16 is a transistor (eighth transistor) that discharges the output node (node N4) of the inverter when the clock signal /CLK is at L level and the inverter is inactive.

In addition, the transistor Q13 is a transistor (fifth transistor) that discharges the node N1 based on the output of the inverter comprising the transistors Q14 and Q15. This transistor Q13 only have to flow a current as small as a leak current of the transistor Q3, so that its on resistance is not necessarily low. Therefore, the transistor Q13 may be small in size.

Figure 24:
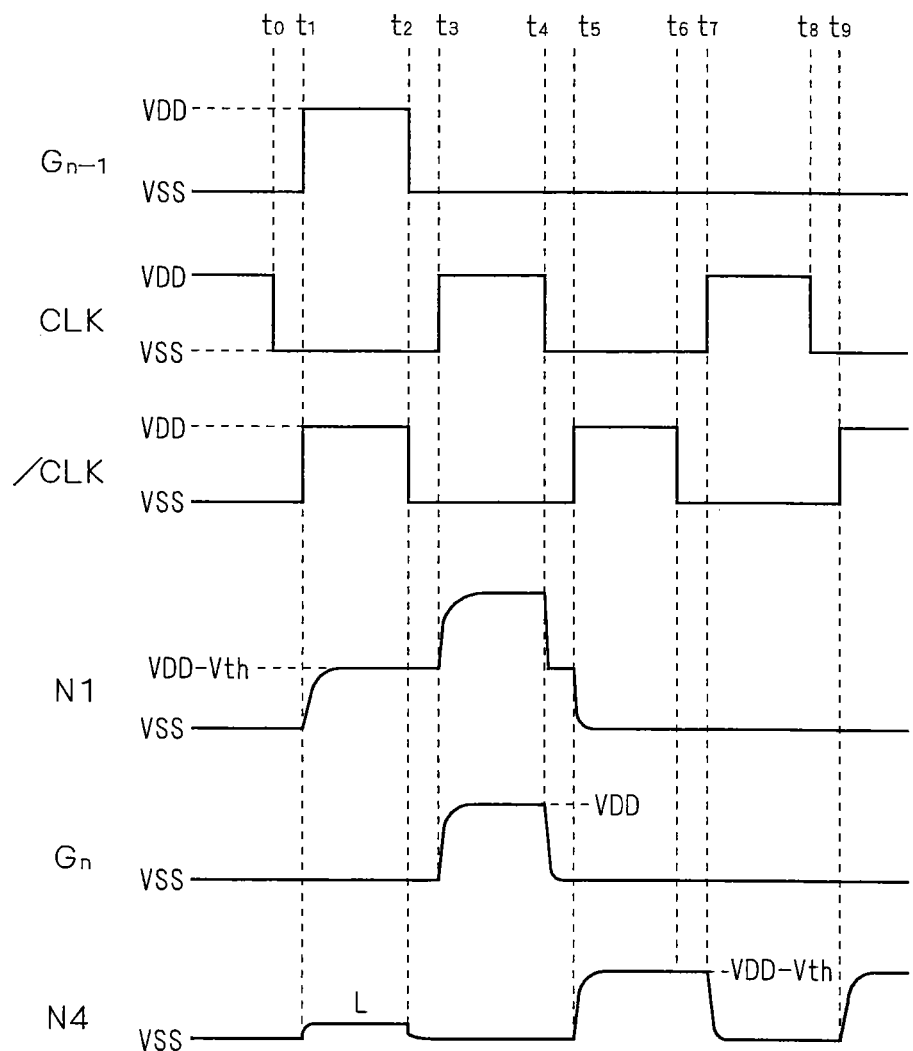
FIG. 24 is a timing chart showing the operation of the unit shift register according to the embodiment 7.

FIG. 24 is a timing chart showing the operation of the unit shift register SR shown in FIG. 23. Although the operation of the unit shift register SR will be described with reference to FIG. 23 hereinafter, since its basic operation is the same as that described with reference to FIG. 8, the operation related to the circuit comprising the transistors Q13 to Q15 will be mainly described.

Here also, as an initial state, it is assumed that the node N1 is in a reset state at L level and the first clock terminal CK1 (clock signal CLK) is at H level, and the second clock terminal CK2 (clock signal /CLK), a reset terminal RST (next stage output signal $G_{n+1}$) and an input terminal IN (previous stage output signal $G_{n-1}$) are at L level.

After the clock signal CLK has been moved to L level at a time $t_0$, when the clock signal /CLK is moved to H level and the previous stage output signal $G_{n-1}$ becomes at H level at a time $t_1$, the transistor Q3 is turned on and the level of the node N1 rises. In addition, the inverter comprising the transistors Q14 and Q15 is activated. Since the transistor Q15 is turned on at this time, the level of the node N4 rises and the transistor Q13 is going to be conductive, but since the on resistance of the transistor Q3 is set sufficiently low as compared with the on resistance of the transistor Q13, the potential of the node N1 rises and becomes H level (VDD−Vth) here. Accordingly, the transistor Q14 is turned on and the node N4 becomes L level determined by the on resistance ratio between the transistors Q15 and Q14. As a result, the unit shift register SR becomes the set state and the transistor Q1 is turned on.

Then, when the previous stage output signal $G_{n-1}$ becomes L level at a time $t_2$, the transistor Q3 is turned off and the node N1 becomes a floating state of H level. At the same time, since the clock signal /CLK also becomes L level, the transistor Q15 is turned off and the inverter comprising the transistors Q14 and Q15 becomes inactive. Thus, since a current is not supplied from the transistor Q15, the level of the node N4 becomes VSS.

In addition, when the clock signal CLK becomes H level at a time $t_3$, since the transistor Q1 is ON, the output signal $G_n$ becomes H level and the level of the node N1 rises. At this time, although the transistor Q16 is turned on, since the node N4 are already at VSS, that level is not changed.

When the clock signal CLK becomes L level at a time $t_4$, the output signal $G_n$ returns to L level, following it. In addition, the transistor Q16 is also turned off.

Then, at a time $t_5$, the clock signal /CLK becomes H level and the next stage output signal $G_{n+1}$ becomes H level. Then, the transistor Q4 is turned on and the level of the node N1 falls and accordingly the transistor Q14 is turned off. In addition, the transistor Q15 is turned on and the inverter comprising the transistors Q14 and 15 is activated, so that the node N4 becomes H level and the transistor Q13 is turned on. Accordingly, the node N1 becomes the reset state of L level.

When the clock signal /CLK becomes L level at a time $t_6$, the transistor Q15 is turned off and the inverter comprising the transistors Q14 and Q15 is inactivated. However, since the node N4 becomes H level of the floating state, the transistor Q13 is still ON and electric charge due to the leak current of the transistor Q3 is prevented from being accumulated in the node N1.

Then, when the clock signal CLK becomes H level at a time $t_7$, since the transistor Q16 is turned on, the node N4 is discharged and becomes L level. Accordingly, the transistor Q13 is turned off. However, since the transistor Q5 is turned on at this time, similar to the embodiment 1, the electric charge of the node N1 is discharged through the transistor Q5.

When the clock signal CLK becomes L level at a time $t_8$, since the transistor Q5 is turned off, the node N1 becomes the floating state and the electric charge due to the leak current of the transistor Q3 starts to be accumulated. However, according to this embodiment, when the clock signal /CLK becomes H level at a time $t_9$, the inverter comprising the transistors Q14 and Q15 is activated and the node N4 becomes H level. Accordingly, the transistor Q13 is turned on, so that the electric charge of the node N1 is discharged through the transistor Q13 this time.

Hereinafter, in the non-selected period until the previous output signal $G_{n-1}$ becomes H level next time, when the clock signal CLK becomes H level, the node N1 is discharged (pulled down) through the transistor Q5 and when the clock signal /CLK becomes H level, it is discharged through the transistor Q13. That is, since this operation is repeated in the non-selected period, the level of the node N1 is prevented from rising.

As described above, according to this embodiment, since the node N1 is prevented from becoming the floating state in the non-selected period of the unit shift register SR, it is prevented that the potential of the node N1 rises due to the leak current of the transistor Q3. That is, a defective operation in the non-selected period can be further prevented and the reliability of the operation can be improved.

In addition, as described above, the node N1 is discharged by the two transistors such as the transistors Q5 and Q13 alternately. That is, since their gates are not continuously biased in the non-selected period but biased at the timing when the clock signals CLK and /CLK become H level, it has an advantage that the problem in the shift of the threshold voltages of the transistors Q5 and Q13 is alleviated.

Figure 25:
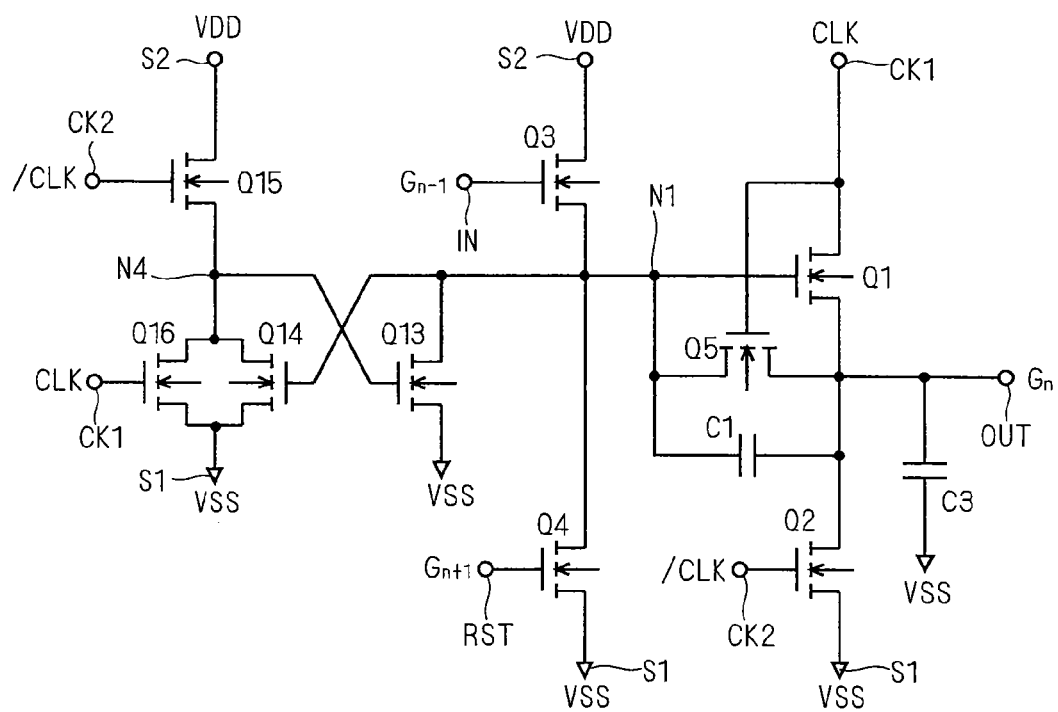
FIG. 25 is a circuit diagram showing the constitution of the unit shift register according to the embodiment 7.

In addition, although the transistor Q15 is diode-connected and the clock signal /CLK is supplied to both gate and drain thereof in FIG. 23, the clock signal /CLK may be supplied to only the gate of the transistor Q5 and another voltage supply may be supplied to the drain. In this case, as shown in FIG. 25, for example, the drain of the transistor Q15 may be connected to a second power supply terminal S2 and the high potential side power supply potential VDD may be supplied.

In addition, as shown in FIG. 26, the source of the transistor Q16 may be connected to the second clock terminal CK2 and the clock signal /CLK may be supplied. In this case, when the clock signal CLK inputted to the gate of the transistor Q16 becomes L level and the transistor Q16 is turned off, since the clock signal /CLK inputted to the source becomes H level, a state equivalent to the case where the gate of the transistor Q16 is negatively biased with respect to the source is provided. Thus, since the positively shifted threshold voltage returns to the negative direction and makes a recovery, the drive capability of the transistor Q16 is prevented from being lowered. Thus, since the drive capability of the transistor Q16 can be largely maintained, the transistor Q16 can be reduced in size.

Figure 27:
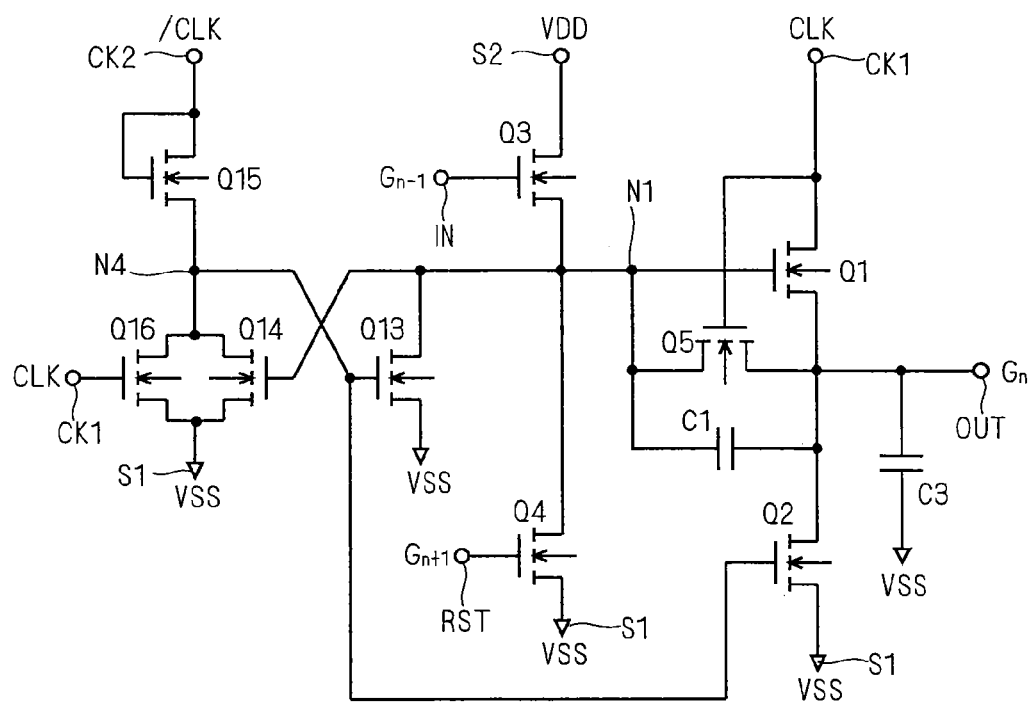
FIG. 27 is a circuit diagram showing the constitution of the unit shift register according to the embodiment 7.

Furthermore, as shown in FIG. 27, the gate of the transistor Q2 may be connected to the node N4. The level of the node N4 in the non-selected period becomes H level when the clock signal /CLK rises, and becomes L level when the clock signal CLK rises, so that the same operation as the above can be implemented. Thus, the degree of freedom in the layout of the circuit can be increased and the area occupied by the circuit can be easily reduced.

In addition, although the clock signal CLK is directly inputted to the gate of the transistor Q5 in the unit shift register SR shown in FIG. 23, the level adjustment circuit 100 shown in the embodiments 5 and 6 (FIGS. 17 to 22) may be used as a matter of course. In addition, although the source of the transistor Q2 is connected to the first power supply terminal S1 in FIG. 23, it may be connected to the first clock terminal CK1 like in the embodiment 3 (FIG. 13) as a matter of course.

Embodiment 8

Figure 28:
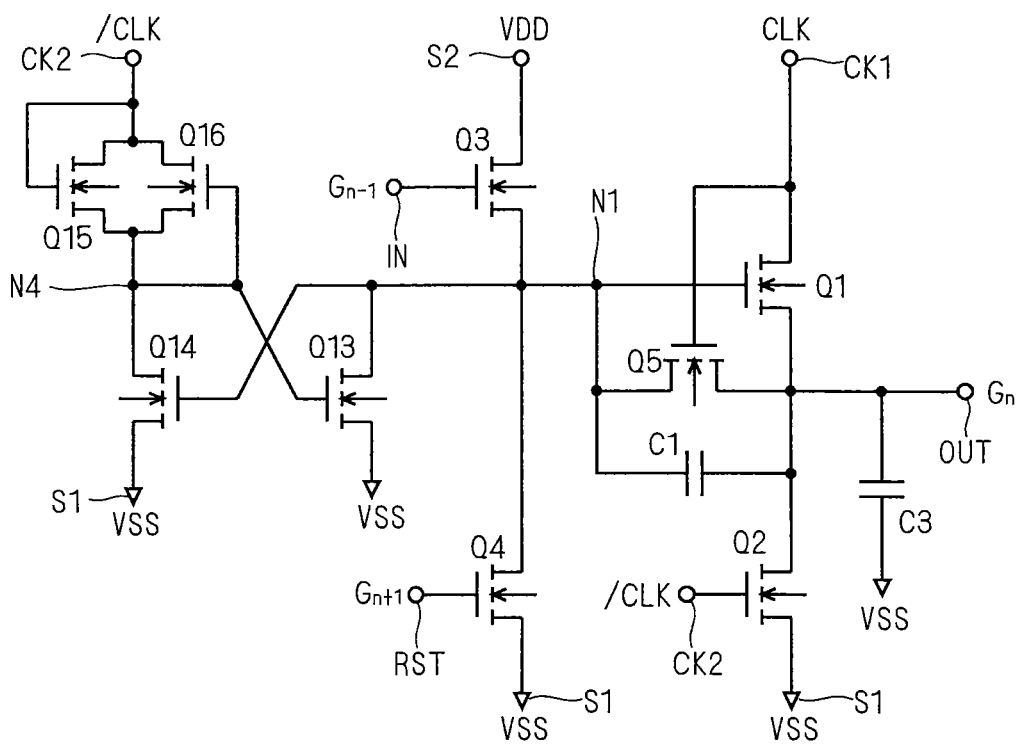
FIG. 28 is a circuit diagram showing the constitution of a unit shift register according to an embodiment 8.

FIG. 28 is a circuit diagram showing a unit shift register SR according to an embodiment 8 of the present invention. According to this embodiment, a constitution in which a transistor Q16 (eighth transistor) for discharging an output node (node N4) when an inverter comprising transistors Q14 and Q15 is inactive is connected between a second clock terminal CK2 and the node N4 is provided in the circuit shown in FIG. 23. In this case, as shown in FIG. 28, the gate of the transistor Q16 is connected to the node N4. That is, the transistor Q16 is diode-connected and functions as a one-way switching element in which a forward direction is from the node N4 to a second clock terminal CK2.

Figure 29:
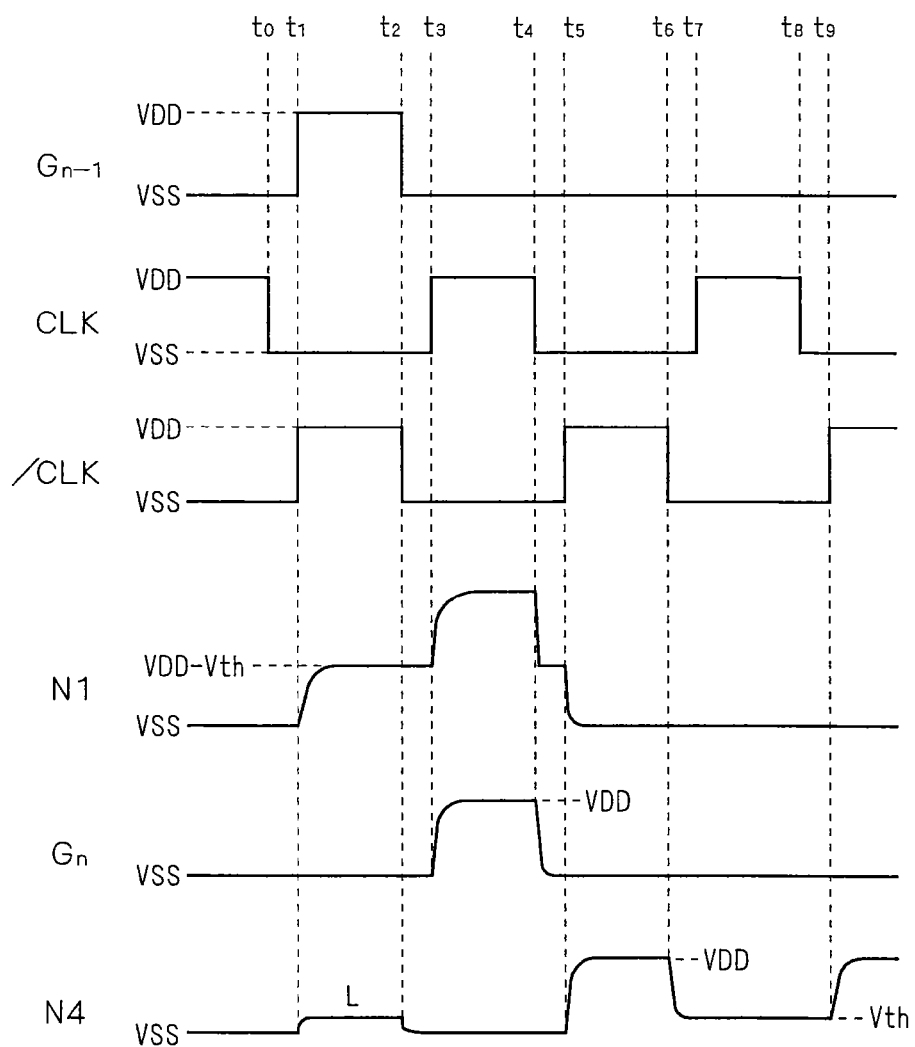
FIG. 29 is a timing chart showing the operation of the unit shift register according to the embodiment 8.

FIG. 29 is a timing chart showing the operation of the unit shift register SR in FIG. 28. Since operations until a time $t_6$ are the same as those of the unit shift register SR shown in 23 described with reference to FIG. 24, their description will be omitted here.

When a clock signal /CLK becomes L level at the time $t_6$, the electric charge of the node N4 is discharged through the transistor Q16. Since the transistor Q16 is diode-connected, the level of the node N4 after discharged falls to the threshold voltage (Vth (Q16)) of the transistor Q16. Then, since the transistor Q13 is turned off, the node N1 becomes a floating state and the electric charge due to the leak current of the transistor Q3 is accumulated in the node N1. However, when the clock signal CLK becomes H level at a time $t_7$ just after that, since a transistor Q5 is turned on, the electric charge of the node N1 is discharged through the transistor Q5 like the embodiment 1.

When the clock signal CLK becomes L level at a time $t_8$, since the transistor Q5 is turned off, the node N1 becomes the floating state again and the electric charge due to the leak current of the transistor Q3 is accumulated. However, the clock signal /CLK becomes H level at a time $t_9$ just after that and the node N4 becomes H level. Accordingly, since the transistor Q13 is turned on, the electric charge of the node N1 is discharged through the transistor Q13 this time.

Thereafter, in the non-selected period until the previous stage output signal $G_{n-1}$ becomes H level next time, when the clock signal CLK becomes H level, the node N1 is discharged (pulled down) through the transistor Q5 and when the clock signal /CLK becomes H level, it is discharged through the transistor Q13. That is, since this operation is repeated in the non-selected period, the level of the node N1 is prevented from rising.

As described above, although this embodiment is different from the embodiment 7 in that the timing when the node N4 is discharged is at the time of falling of the clock signal /CLK (time $t_6$) and the level of the node N4 after discharged is at the threshold voltage of the transistor Q16, other operations are almost the same and the same effect can be provided.

In addition, although the transistor Q15 is diode-connected and the clock signal /CLK is supplied to both gate and drain thereof in FIG. 28, the clock signal /CLK may be supplied to only the gate of the transistor Q5 and another voltage supply may be supplied to the drain. In this case, for example, the drain of the transistor Q15 may be connected to a second power supply terminal S2 and the high potential side power supply potential VDD may be supplied to it (refer to FIG. 25).

Figure 30:
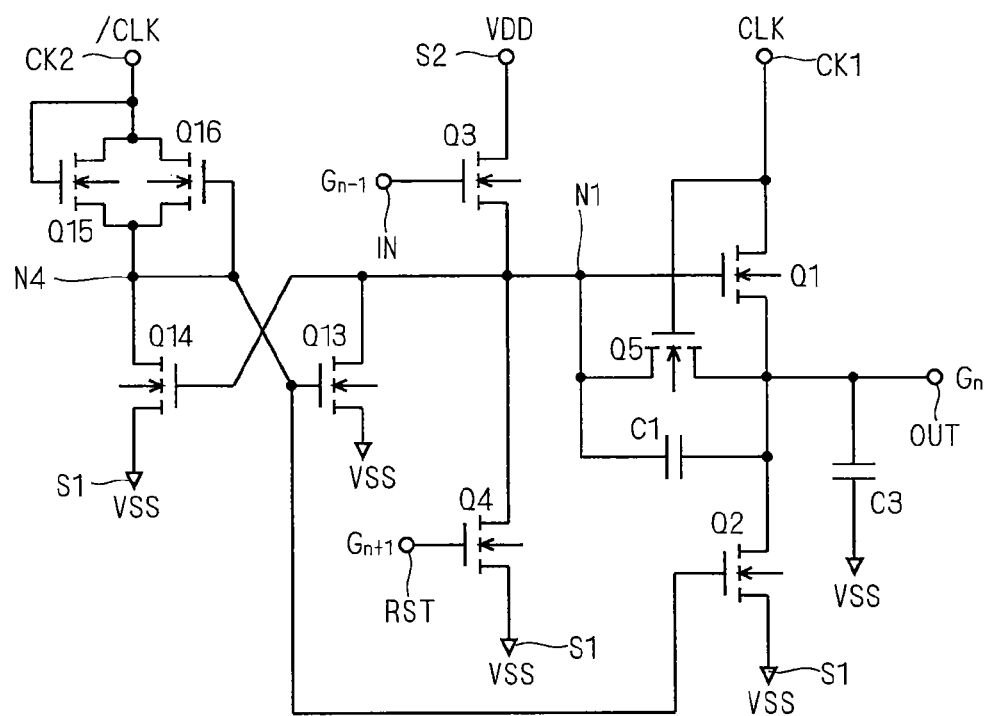
FIG. 30 is a circuit diagram showing the constitution of the unit shift register according to the embodiment 8.

In addition, as shown in FIG. 30, the gate of the transistor Q2 may be connected to the node N4. Since the level of the node N4 in the non-selected period follows the level of the clock signal /CLK, the same operation as the above can be performed in this constitution. Thus, the degree of freedom of the layout of the circuit is increased and the area occupied by the circuit can be easily reduced.

In addition, although the clock signal CLK is directly inputted to the gate of the transistor Q5 in the unit shift register SR shown in FIG. 28, the level adjustment circuit 100 shown in the embodiments 5 and 6 (FIGS. 17 to 22) may be used. In addition, although the source of the transistor Q2 is connected to the first power supply terminal S1 in FIG. 28, it may be connected to the first clock terminal CK1 like in the embodiment 3 (FIG. 13).

Embodiment 9

Figure 31:
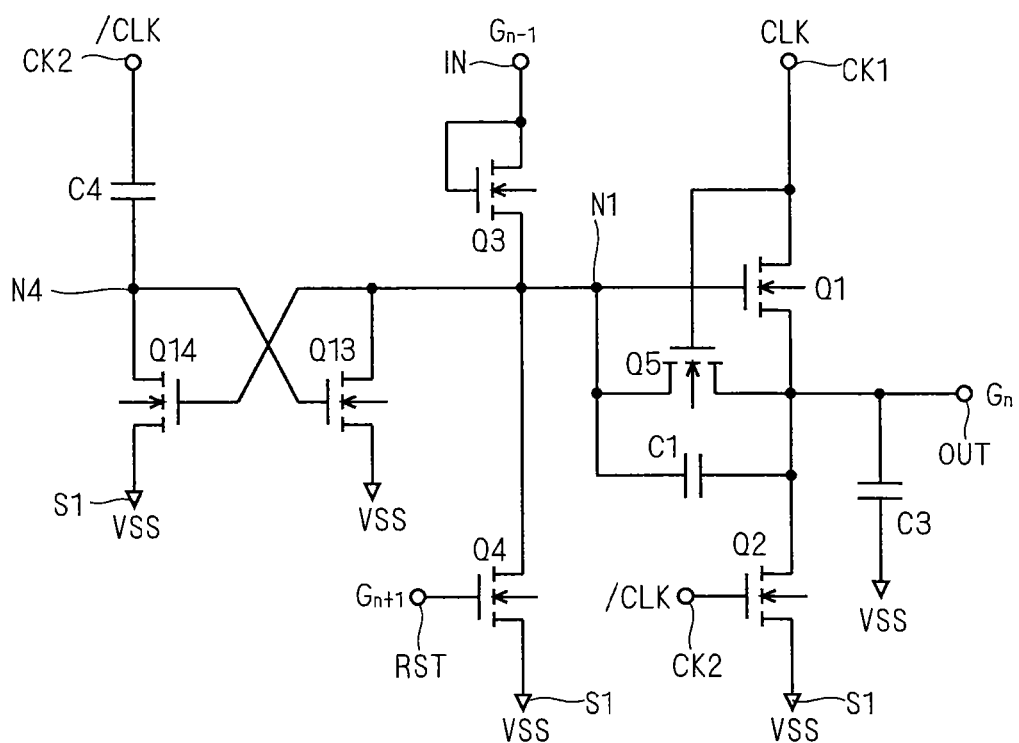
FIG. 31 is a circuit diagram showing the constitution of a unit shift register according to an embodiment 9.

FIG. 31 is a circuit diagram showing a unit shift register SR according to an embodiment 9. According to the unit shift register SR, the transistors Q15 and Q16 shown in FIG. 23 are replaced with a capacity element C4. As shown in FIG. 31, the capacity element C4 is connected between a node N4 and a second clock terminal CK2. In addition, a transistor Q14 is connected between the node N4 and a first power supply terminal S1 like in FIG. 23, and its gate is connected to a node N1.

The circuit comprising the transistor Q14 and the capacity element C4 also functions as an inverter that is activated when a clock signal /CLK becomes H level. That is, when its input node (node N1) is at L level, since the transistor Q14 is OFF, its output node (node N4) becomes H level due to coupling through the capacity element C4 when the clock signal /CLK becomes H level. Meanwhile, in a case where the input node (node N1) is at H level, since the transistor Q14 is OFF, even when the clock signal /CLK becomes H level, the output node (node N4) does not rise but becomes L level.

FIG. 32 is a timing chart showing the operation of the unit shift register SR shown in FIG. 31. Hereinafter, although the operation of the unit shift register SR will be described with reference to FIG. 32, since its basic operation is the same as that described with reference to FIG. 29, the behavior of the level of the node N4 will be mainly described.

Here also, as an initial state, it is assumed that the node N1 is in a reset state at L level and the first clock terminal CK1 (clock signal CLK) is at H level, and the second clock terminal CK2 (clock signal /CLK), a reset terminal RST (next stage output signal $G_{n+1}$), and an input terminal IN (previous stage output signal $G_{n-1}$) are at L level.

After the clock signal CLK has been moved to L level at a time $t_0$, the clock signal /CLK rises at a time $t_1$. Then, although the level of the node N4 rises due to the capacity coupling through the capacity element C4, since the transistor Q3 is turned on and the node N1 becomes H level at this time, the transistor Q14 is turned on and the node N4 is immediately discharged to VSS level. That is, although the node N4 becomes H level instantly, since the node N2 is charged by the transistor Q3 at this time, the node N1 becomes H level without any problem.

Although the clock signal /CLK falls and the level of the node N4 falls at a time $t_2$, it returns to VSS level immediately because the node N1 is at H level and the transistor Q14 is ON.

In addition, when the clock signal CLK becomes H level at a time $t_3$, an output signal $G_n$ becomes H level, and when the clock signal CLK becomes L level at a time $t_4$, the output signal $G_n$ returns to L level. The level of the node N4 is not changed in that period.

When the clock signal /CLK rises at a time $t_5$, the level of the node N4 rises. At this time, when the transistor Q4 is turned on by the next stage output signal $G_{n+1}$ and the node N1 becomes L level, since the transistor Q14 is turned off accordingly, the node N4 is maintained at a specific level.

The clock signal /CLK falls and the level of the node N4 falls at a time $t_6$ at the same time. At this time, since the level of the node N1 is at VSS level, when the voltage between the gate (node N1) and the source (here, node N4 in view of potential relation) of the transistor Q14 becomes Vth or more, the transistor Q14 is turned on. As a result, the level of the node N4 becomes −Vth (Q14) that is lower than VSS by the threshold voltage of the transistor Q14.

Since the transistor Q13 is OFF at this time, the node N1 becomes a floating state and the electric charge due to the leak current of the transistor Q3 is accumulated in the node N1. However, when the clock signal CLK becomes H level at a time $t_7$ just after that, since the transistor Q5 is turned on, the electric charge of the node N1 is discharged through the transistor Q5 like in the embodiment 1.

Then, when the clock signal CLK becomes L level at a time $t_8$, since the transistor Q5 is turned off, the node N1 becomes the floating state again and the electric charge due to the leak current of the transistor Q3 starts to be accumulated. However, when the clock signal /CLK becomes H level at a time $t_9$ just after that, the node N4 rises by a predetermined voltage (ΔV shown in FIG. 32) and becomes H level due to the coupling through the capacity element C4. At this time, since the node N1 is at L level and the transistor Q13 is OFF, while the clock signal /CLK is at H level, the H level of the node N4 is maintained. Since the rising voltage value (ΔV) is determined by the capacity element C4 and the parasitic capacity of the node N4, the capacity element C4 is set to the value previously so as to be sufficiently at H level.

Subsequently, in the non-selected period until the previous stage output signal $G_{n-1}$ becomes H level next time, the discharging (pull-down) of the node N1 through the transistor Q5 when the clock signal CLK is at H level and discharging through the transistor Q13 when the clock signal /CLK is at H level are repeated and the level of the node N1 is prevented from rising like in the embodiment 7.

As shown in FIG. 33, the gate of the transistor Q2 may be connected to the node N4. Since the level of the node N4 in the non-selected period follows the level of the clock signal /CLK, the same operation as the above can be performed even in such constitution. Thus, the degree of freedom of the layout of the circuit can be increased and the area occupied by the circuit can be easily reduced. However, it is to be noted that since the parasitic capacity value of the node N4 is increased, it is necessary to increase the capacity value of the capacity element C4 considerably to keep the voltage value ($\Delta$V) that rises at the time $t_9$ great.

In addition, although the clock signal CLK is directly inputted to the gate of the transistor Q5 in the unit shift register SR shown in FIG. 31, the level adjustment circuit 100 shown in the embodiments 5 and 6 (FIGS. 17 to 22) may be used of course. In addition, although the source of the transistor Q2 is connected to the first power supply terminal S1 in FIG. 31, it may be connected to the first clock terminal CK1 like in the embodiment 3 (FIG. 13).

Embodiment 10

Figure 34:
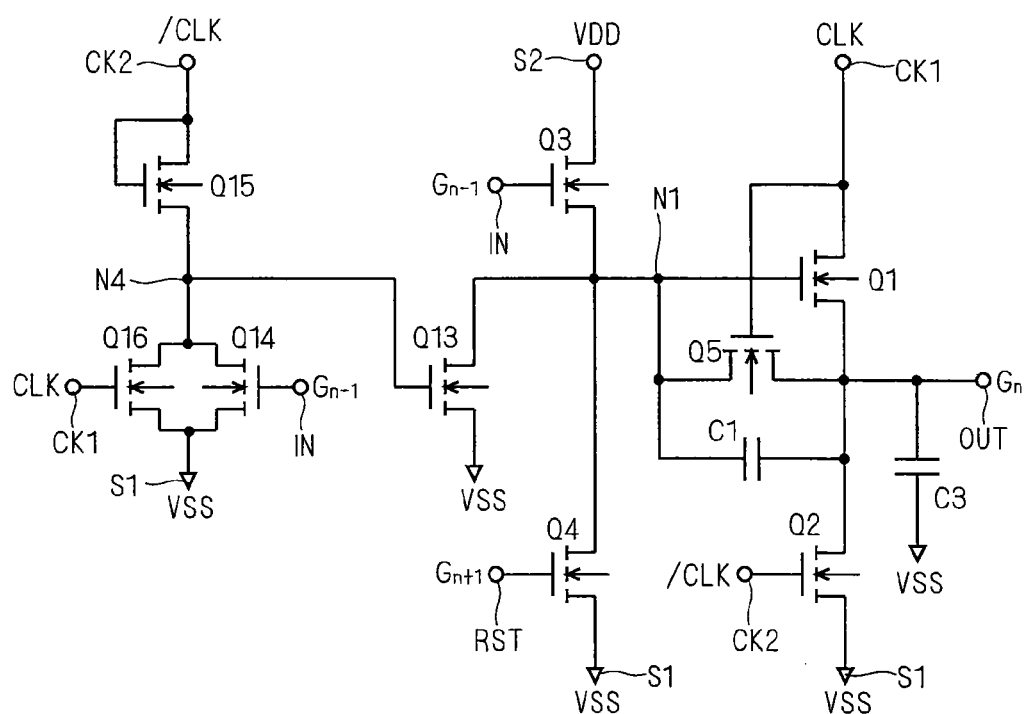
FIG. 34 is a circuit diagram showing the constitution of a unit shift register according to an embodiment 10.

FIG. 34 is a circuit diagram showing a unit shift register SR according to an embodiment 10. According to this embodiment, the gate of the transistor Q14 is connected to the input terminal IN in the unit shift register SR in the embodiment 7 (FIG. 23). That is, to the gate of the transistor Q14 of the unit shift register SR, its previous stage output signal (a start pulse SP in the case of the first stage) is inputted.

Although the transistor Q14 of the circuit in FIG. 23 is turned on while the node N1 is at H level (for times $t_1$ to $t_5$ in FIG. 24), the transistor Q14 of the unit shift register SR in FIG. 34 is turned on while the input terminal IN (previous stage output signal or start pulse SP) is at H level (for times $t_1$ to $t_2$ in FIG. 24). Therefore, although the timing of the unit shift register SR in the embodiment 10 when the transistor Q14 returns to OFF is earlier, since a transistor Q16 is turned on just after the transistor Q14 has returned to OFF to discharge the node N4, the operation of the unit shift register SR is almost the same as that of the embodiment 7. Therefore, the same effect as that in the embodiment 7 can be provided in this embodiment also.

In addition, although the transistor Q 14 in FIG. 23 is turned on after the node N1 has started to be charged, the transistor Q14 in FIG. 34 is immediately turned on when the previous stage output signal rises. Therefore, according to this embodiment, since the transistor Q13 can be surely turned on when the node N1 starts to be charged, the node N1 can be easily charged.

Furthermore, according to this embodiment, since the gate of the transistor Q14 is not connected to the node N1, the parasitic capacity associated with the node N1 is smaller by the gate capacity of the transistor Q14 as compared with the circuit in FIG. 23. Therefore, the node N1 can rise more effectively when the output signal is outputted (selected period), which contributes to the drive capability of the transistor Q1, that is, the improvement in the drive capability of the unit shift register SR.

In addition, this embodiment can be widely applied to the unit shift register SR (embodiments 7 to 9) comprising the inverter containing the transistor Q14. In addition, the level adjustment circuit 100 shown in the embodiments 5 and 6 (FIGS. 17 to 22) can be applied to the unit shift register SR in this embodiment. Furthermore, the source of the transistor Q2 may be connected to the first clock terminal CK1 like in the embodiment 3.

Embodiment 11

FIG. 35 is a circuit diagram showing a unit shift register SR according to an embodiment 11 of the present invention. According to this embodiment, the source of the transistor Q13 is connected to the first clock terminal CK1 in the unit shift register SR in the embodiment 7 (FIG. 23).

According to the embodiment 7, a node N4 of a n-th unit shift register $SR_n$ (gate of a transistor Q13) becomes repeatedly H level approximately in synchronization with a clock signal /CLK in a non-selected period (more specifically, it becomes H level when the clock signal /CLK rises and becomes L level when a clock signal CLK rises). Since the source of the transistor Q13 is fixed to the potential VSS in the circuit shown in FIG. 23, the gate is repeatedly positively biased, so that its threshold voltage is likely to be shifted.

Meanwhile, according to this embodiment, when the gate of the transistor Q13 becomes L level, since the clock signal CLK inputted to its source becomes H level, the state equivalent to the case where the gate of the transistor Q13 is negatively biased with respect to the source is provided. Thus, since a threshold voltage that shifted in the positive direction returns in the negative direction and makes a recovery, there is an effect that the drive capability of the transistor Q13 is prevented from being lowered and the operation life of the circuit can be elongated.

In addition, this embodiment can be widely applied to the unit shift register SR (embodiments 7 to 10) containing the transistor Q13. In addition, the level adjustment circuit 100 shown in the embodiments 5 and 6 (FIGS. 17 to 22) can be applied to the unit shift register SR in this embodiment. Furthermore, the source of the transistor Q2 may be connected to the first clock terminal CK1 like in the embodiment 3.

Embodiment 12

Although each unit shift register SR has the level adjustment circuit 100 in the embodiment 5 (FIG. 17), the plurality of unit shift registers can share one level adjustment circuit 100.

FIG. 36 is a view showing a shift register according to an embodiment 12, in which multistage (plural-stage) shift register comprises the plurality of cascade-connected unit shift registers SR. In FIG. 36, four stages from n-th to (n+3)th circuits are shown (it is assumed that n is an odd number).

The multistage shift register according to this embodiment comprises a level adjustment circuit (common level adjustment circuit) 100A shared by odd-stage unit shift registers SR and a level adjustment circuit (common level adjustment circuit) 100B shared by even-stage unit shift registers SR. Therefore, the gate node (node N3 in FIG. 17) of odd-stage transistors Q5 are shared and similarly, the gate node of even-stage transistors Q5 are shared. Hereinafter, the common node N3 in the odd stages is referred to as the "node N3A" and the common node N3 in the even stages is referred to as the "node N3B".

In FIG. 36, the common level adjustment circuits 100A and 100B have the same circuit constitution as that of the level adjustment circuit 100 shown in FIG. 17. That is, transistors Q9A and Q9B in FIG. 36 correspond to the transistor Q9 shown in FIG. 17, transistors Q10A and Q10B in FIG. 36 correspond to the transistor Q10 shown in FIG. 17, and clock terminals CK1A and CK1B in FIG. 36 correspond to the first clock terminal CK1 shown in FIG. 17. This is only one example, and the common level adjustment circuits 100A and 100B may have any circuit constitution shown in FIGS. 17 to 22.

The common level adjustment circuit 100A generates a signal having an amplitude smaller than that of the clock signal CLK and supplies it to the node N3A (more specifically, the node N3A becomes H level at the time of rising of the clock signal CLK and becomes L level at the time of rising of the clock signal /CLK). Meanwhile, the common level adjustment circuit 100B generates a signal having an amplitude smaller than that of the clock signal /CLK and supplies it to the node N3B (more specifically, the node N3B becomes H level at the time of rising of the clock signal /CLK and becomes L level at the time of rising of the clock signal CLK).

Therefore, each unit shift register SR can perform the same operation as that of the unit shift register SR shown in FIG. 17, so that the same effect as that of the embodiment 5 is provided. Furthermore, since the plurality of unit shift registers SR share the common level adjustment circuits 100A and 100B, which contributes to the reduction in the area where the circuit is formed.

In addition, as described in the embodiment 6, it is thought that in the unit shift register SR shown in FIG. 17, when the gate capacity of the transistor Q5 is considerably larger than the parasitic capacity associated with its gate node (node N3), the level of the node N3 rises due to the coupling through the overlap capacity between the gate and drain of the transistor Q5 when its output signal rises. When this level rising of the node N3 is large, the problem is that the transistor Q5 is turned on and the level of the node N1 falls while the output signal is at H level (the transistor Q12 in FIG. 20 is provided to solve that problem).

According to this embodiment, the gate node (node N3A) of the transistor Q5 is shared by the odd-stage unit shift registers SR and similarly, the gate node (node N3B) of the transistor Q5 is shared by the even-stage unit shift registers SR. That is, the gate capacities of the transistors Q5 of the unit shift registers SR contribute to the parasitic capacities of the nodes N3A and N3B. Therefore, the parasitic capacity associated with the gate node of the transistor Q5 in each unit shift register SR is considerably large as compared with the circuit shown in FIG. 17, so that the above problem does not arise. Therefore, there is no need to provide the transistor Q12 in the common level adjustment circuits 100A and 100B unlike the level adjustment circuit 100 shown in FIG. 20.

In addition, although the example in which the unit shift register SR has the circuit constitution shown in FIG. 17 is shown in FIG. 36, it can be widely applied to the unit shift register SR comprising the level adjustment circuit 100.

Embodiment 13

Figure 37:
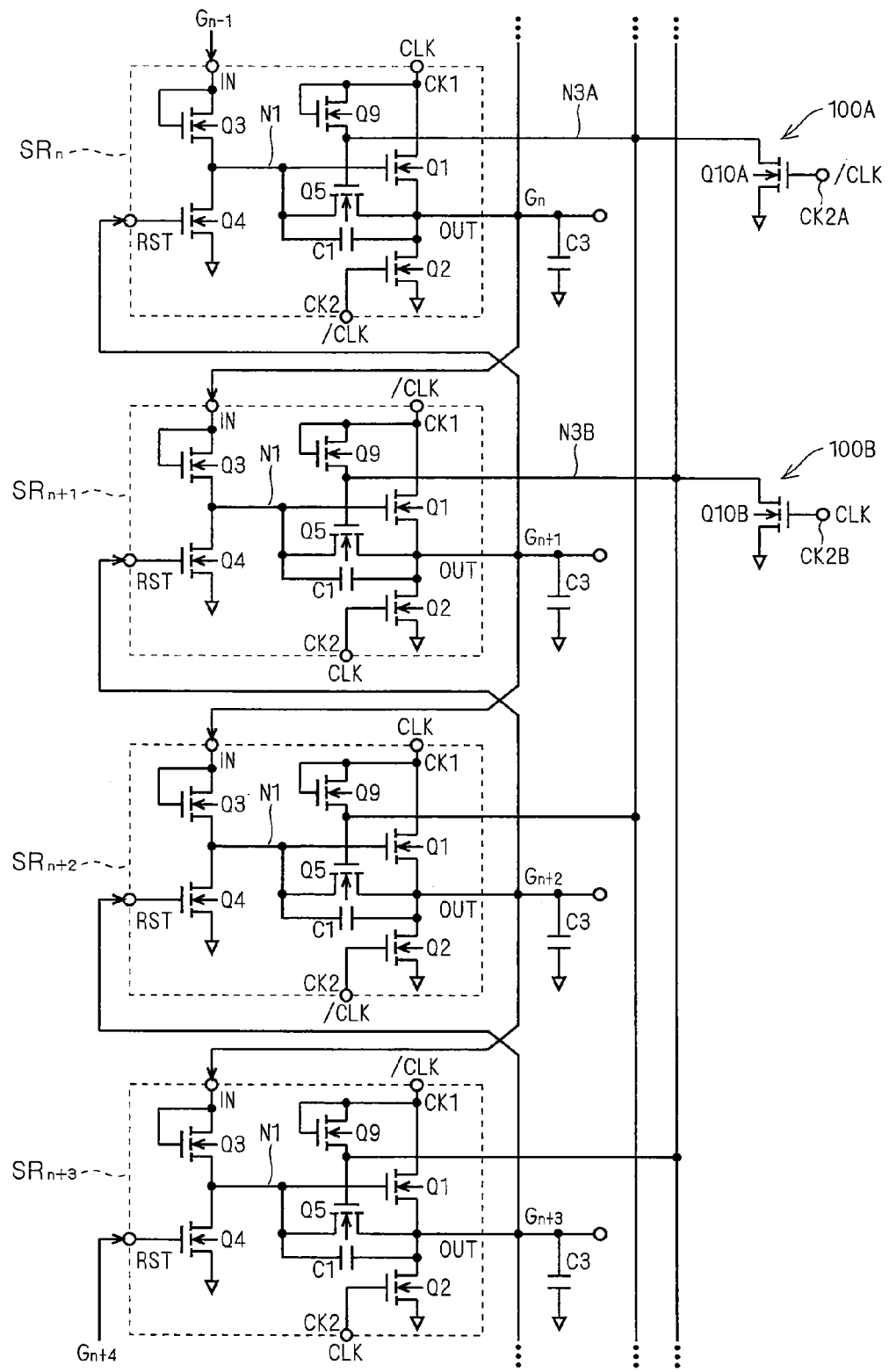
FIG. 37 is a circuit diagram showing the constitution of a multistage shift register according to an embodiment 13.

This embodiment shows one example of a multistage shift register in which a plurality of unit shift registers SR share a level adjustment circuit 100. FIG. 37 is a view showing the constitution of a shift register according to an embodiment 13, in which a plurality of unit shift registers SR are cascade-connected in the multistage shift register. In this drawing also, four stages from n-th to (n+3)th circuits are shown (it is assumed that n is a odd number).

According to this embodiment, only a transistor Q10 of the transistors Q9 and Q10 constituting the level adjustment circuit 100 is shared and the transistor Q9 is provided in each of the unit shift registers SR. That is, common level adjustment circuits 100A and 100B comprise only transistors Q10A and Q10B, respectively.

In this embodiment also, almost the same effect as that of the embodiment 12 can be provided. However, it is to be noted that since the transistor Q9 is provided in each unit shift register SR, the effect that the circuit area becomes small is reduced as compared with the embodiment 12. However, when the transistor Q9 is provided in each unit shift register SR, the following another effect can be provided.

That is, when the transistor Q9 is provided in each unit shift register SR, the distance between the source of the transistor Q9 and the gate of the transistor Q5 is equal in each stage unit shift register SR, and the parasitic resistance therebetween is also equal. As a result, the timing when the gate of the transistor Q5 becomes H level is prevented from varying in the unit shift registers SR.

As described with reference to FIG. 9, the current (I (Q5)) flowing in the transistor Q5 at the time of the rising of the output signal affects the relation of the timing between the rising of the gate of the transistor Q5 (clock signal CLK in the example of FIG. 9) and the rising of the output signal. According to this embodiment, since the timing when the gate of the transistor Q5 becomes H level is almost constant in each unit shift register SR, the variation in current of the transistor Q5 is prevented. Therefore, the electric charge can be prevented from leaking from the node N1 to the output terminal OUT when the output signal rises.

Embodiment 14

Figure 38:
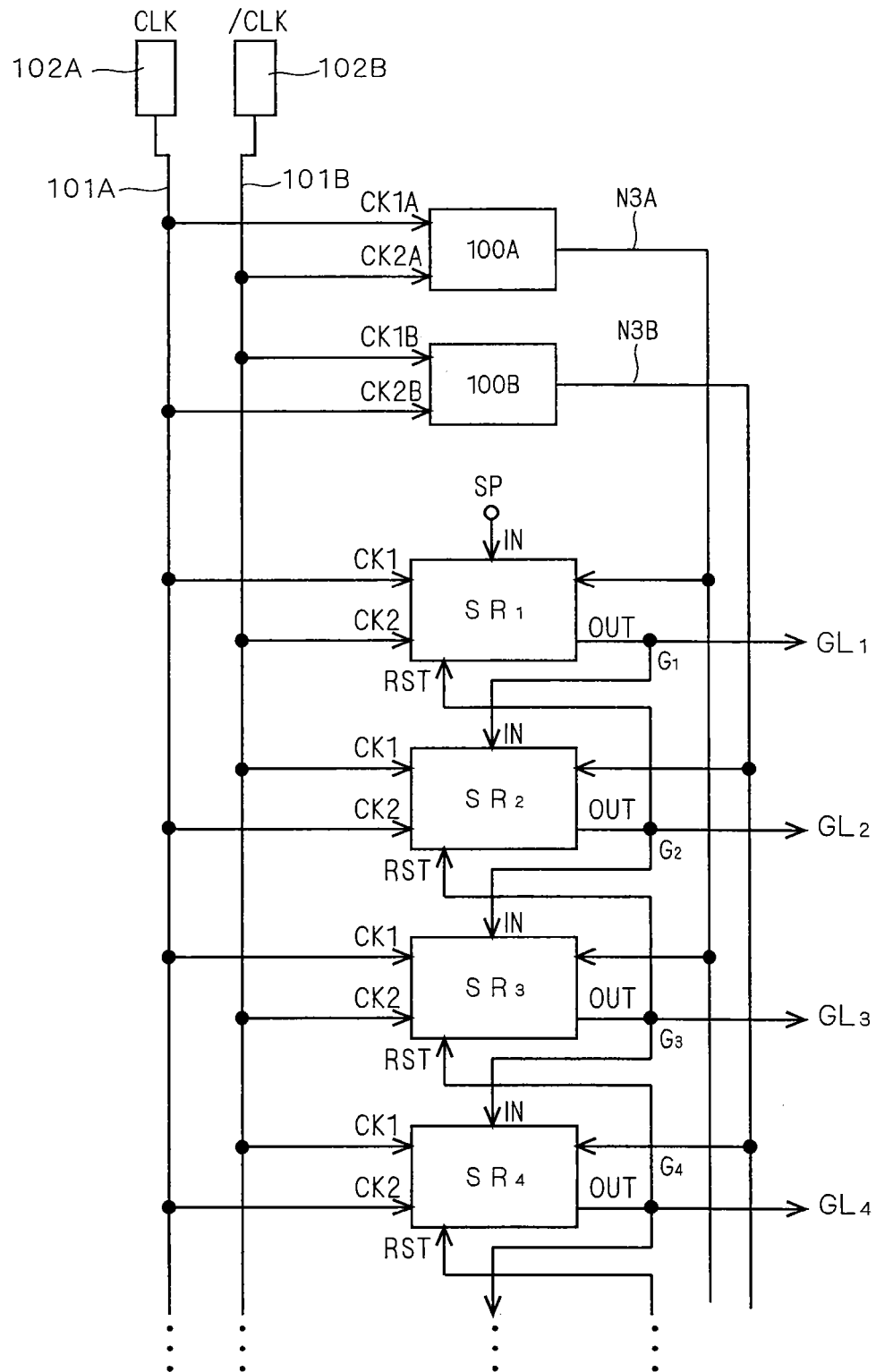
FIG. 38 is a circuit diagram showing the constitution of a multistage shift register according to an embodiment 14.

FIG. 38 is a view showing the constitution of a multistage shift register according to an embodiment 14 of the present invention. According to the shift register in this embodiment, a plurality of unit shift registers SR share common level adjustment circuits 100A and 100B like in the embodiments 12 and 13. FIG. 38 shows the arrangements of the plurality of unit shift registers SR and the common level adjustment circuits 100A and 100B.

As described in the embodiment 13 also, the current flowing in the transistor Q5 at the time of rising of the output signal is affected by the timing relation between the rising of the gate of the transistor Q5 and the rising of the output signal. Therefore, it is preferable that the timing relation is constant among all unit shift registers SR.

For example, a multistage shift register constituting a gate line drive circuit 30 of a display comprises several hundreds of cascade-connected unit shift registers SR (640 stages in the display of VGA size, for example). In this case, the length of the wiring (clock wiring) required when the unit shift registers SR share the clock signals CLK and /CLK is several centimeters, so that the influence of the parasitic impedance of the clock wiring cannot be ignored. That is, there is generated the considerable time difference in the timing when the clock signals CLK and /CLK are inputted between the unit shift register SR that is closest to an external connection terminal for inputting the clock signals CLK and /CLK generated from a clock generator 31 as an external circuit to the clock wiring, and the unit shift register SR furthest from that external connection terminal.

That is, as shown in FIG. 38, when the unit shift registers SR₁, ST₂, ..., SRₙ are connected in this order from the side closer to external connection terminals 102A and 102B for connecting the clock wirings 101A and 101B to the clock generator 31 (not shown), the clock signals CLK and /CLK are inputted to the unit shift register SRₙ farthest from the external connection terminals 102A and 102B after they have inputted to the unit shift register SR1 closest thereto.

Thus, according to this embodiment, the common level adjustment circuits 100A and 100B are arranged close to the unit shift register SR1 that is closest to the external connection terminals 102A and 102B. That is, it means that the unit shift registers SR₁, ST₂, ..., SRₙ are connected in this order from the side closer to the common level adjustment circuits 100A and 100B in the wiring as the nodes N3A and N3B. That is, the distance from the unit shift register SR to the external connection terminals 102A and 102B and the distance from the unit shift register SR to the common level adjustment circuits 100A and 100B are almost equal to each other.

The signals (having amplitudes smaller than the clock signals CLK and /CLK) outputted from the common level adjustment circuits 100A and 100B are transmitted to each unit shift register SR through the wiring of the nodes N3A and N3B, and the same delay as that of the clock wirings 101A and 101B is generated in these wiring theoretically. Therefore, according to this embodiment, the phase relation between the clock signals CLK and /CLK from the external connection terminals 102A and 102B and the signals from the common level adjustment circuits 100A and 100B can be almost constant over all of the unit shift registers SR.

In addition, since the unit shift registers SR₁, ST₂, ..., SRₙ are connected in this order from the side closer to the external connection terminals 102A and 102B in FIG. 38, the common level adjustment circuits 100A and 100B are provided close to the unit shift register SR1. However, it is not necessarily the first stage but any stage can be provided. There is a case where a unit shift register SR other than the first stage unit shift register SR₁ is closest to the external connection terminals 102A and 102B depending on its layout. That is, the common level adjustment circuits 100A and 100B only have to be arranged close to the external connection terminals 102A and 102B or close to the unit shift register SR that is closest to the external connection terminals 102A and 102B.

While the invention has been shown and described in detail, the foregoing description is in all aspects illustrative and not restrictive. It is therefore understood that numerous modifications and variations can be devised without departing from the scope of the invention.

What is claimed is:

1. A shift register circuit comprising:
   an input terminal, an output terminal, a first clock terminal, and a reset terminal,
   a first transistor for supplying a first clock signal inputted to the first clock terminal to the output terminal;
   a drive circuit for driving the first transistor by charging a control electrode of the first transistor based on a signal inputted to the input terminal, and discharging the control electrode of the first transistor based on a signal inputted to the reset terminal;
   a switching circuit for making the control electrode of the first transistor and the output terminal conductive based on the first clock signal in a state when the control electrode of the first transistor is discharged;
   an inverter having a node to which the control electrode of the first transistor is connected as an input node and activated by a second clock signal having a phase different from that of the first clock signal; and
   a second transistor for discharging the control electrode of the first transistor based on the output of the inverter,
   wherein the second transistor is connected between the control electrode of the first transistor and the first clock terminal.

2. The shift register circuit according to claim 1, wherein the inverter comprises:
   a third transistor connected between the output node of the inverter and a predetermined first power supply terminal and having a control electrode that becomes the input node of the inverter, and
   a fourth transistor connected between the output node and a second clock terminal to which the second clock signal is supplied and having a control electrode connected to the second clock terminal.

3. The shift register circuit according to claim 2, further comprising:
   a fifth transistor discharging the output node of the inverter when the inverter becomes inactive.

4. The shift register circuit according to claim 3, wherein the fifth transistor is connected between the output node of the inverter and the predetermined first power supply terminal and having a control electrode connected to the first clock terminal.

* * * * *